United States Patent
Yun et al.

(10) Patent No.: US 11,404,522 B2
(45) Date of Patent: Aug. 2, 2022

(54) DISPLAY DEVICE HAVING FIRST AND SECOND GATES DISPOSED ON A FIRST SIDE OF AN ACTIVE AREA AND A PATTERN DISPOSED ON A SECOND SIDE OF THE ACTIVE AREA

(71) Applicant: Samsung Display Co., Ltd., Yongin-Si (KR)

(72) Inventors: Suyeon Yun, Seoul (KR); Sunghoon Kim, Seoul (KR); Anna Ryu, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 1 day.

(21) Appl. No.: 16/875,034

(22) Filed: May 15, 2020

(65) Prior Publication Data
US 2020/0365677 A1 Nov. 19, 2020

(30) Foreign Application Priority Data
May 17, 2019 (KR) .......................... 10-2019-0057994

(51) Int. Cl.
H01L 29/08 (2006.01)
H01L 27/32 (2006.01)
G09G 3/3266 (2016.01)
G09G 3/3275 (2016.01)

(52) U.S. Cl.
CPC ....... *H01L 27/3276* (2013.01); *G09G 3/3266* (2013.01); *G09G 3/3275* (2013.01); *H01L 27/3262* (2013.01); *H01L 27/3265* (2013.01)

(58) Field of Classification Search
CPC ........... H01L 27/3276; H01L 27/3262; G09G 3/3275; G09G 3/3266
See application file for complete search history.

(56) References Cited

U.S. PATENT DOCUMENTS 10,074,710 B2  9/2018  Ebisuno et al.
10,381,426 B2  8/2019  Ka et al.
(Continued)

FOREIGN PATENT DOCUMENTS

KR  10-2016-0043327  4/2016
KR  10-2018-0004369  1/2018
(Continued)

*Primary Examiner* — Phuc T Dang
(74) *Attorney, Agent, or Firm* — F. Chau & Associates, LLC

(57) ABSTRACT

A display device including: a panel including pixels, a pixel including: an LED; a capacitor between a first voltage line and a node; a first transistor between the first voltage line and a first electrode of the LED; a second transistor between a data line and a source of the first transistor; a third transistor between the node and a drain of the first transistor; a fourth transistor between the node and a second voltage line; a fifth transistor between the first voltage line and the source of the first transistor; a sixth transistor between the first electrode and the drain of the first transistor; and a seventh transistor between the second voltage line and the first electrode, the third and fourth transistor including: an active area including metal oxide; first and second gates above the active area; and a pattern below the active area.

11 Claims, 28 Drawing Sheets

(56) References Cited

U.S. PATENT DOCUMENTS

| | | | |
|---|---|---|---|
| 2002/0104995 A1* | 8/2002 | Yamazaki | H01L 27/1255 257/72 |
| 2016/0293643 A1 | 10/2016 | Kim et al. | |
| 2017/0365214 A1* | 12/2017 | Tsai | G09G 3/3233 |
| 2017/0365647 A1* | 12/2017 | Choi | G09G 3/3233 |
| 2018/0040682 A1 | 2/2018 | Ebisuno et al. | |
| 2018/0166516 A1 | 6/2018 | Chai et al. | |
| 2018/0190204 A1 | 7/2018 | Shin et al. | |
| 2018/0233575 A1 | 8/2018 | Kim et al. | |
| 2018/0248045 A1 | 8/2018 | Lim et al. | |
| 2018/0286307 A1 | 10/2018 | Kim et al. | |
| 2018/0315373 A1 | 11/2018 | Wang et al. | |
| 2019/0067398 A1* | 2/2019 | Liu | H01L 27/3262 |
| 2019/0115407 A1 | 4/2019 | Cho et al. | |

FOREIGN PATENT DOCUMENTS

| | | |
|---|---|---|
| KR | 10-2018-0026602 | 3/2018 |
| KR | 10-2018-0067768 | 6/2018 |

\* cited by examiner

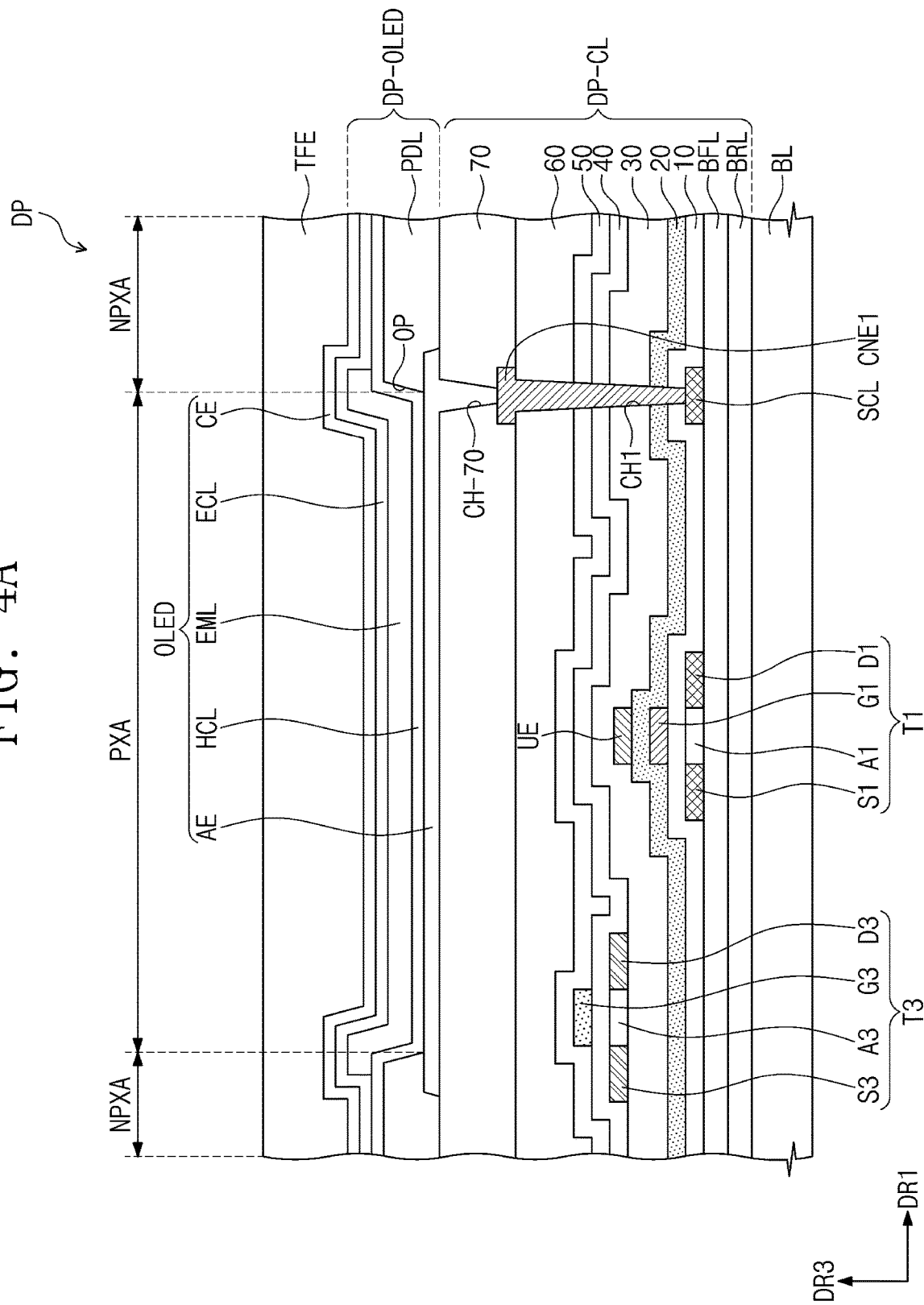

DISPLAY DEVICE HAVING FIRST AND SECOND GATES DISPOSED ON A FIRST SIDE OF AN ACTIVE AREA AND A PATTERN DISPOSED ON A SECOND SIDE OF THE ACTIVE AREA

CROSS-REFERENCE TO RELATED APPLICATION

This U.S. non-provisional patent application claims priority under 35 U.S.C. § 119 to Korean Patent Application No. 10-2019-0057994, filed on May 17, 2019, the disclosure of which is incorporated by reference herein in its entirety.

1. Technical Field

The present inventive concept relates to a display device. More particularly, the present inventive concept relates to a display device having two types of transistors.

2. Description of the Related Art

A display device is an output device for presentation of information in visual form. A display device includes a plurality of pixels and a driving circuit for controlling the pixels. The driving circuit includes, e.g., a scan driving circuit and a data driving circuit. Each of the pixels includes a display element and a pixel driving circuit for controlling the display element. The pixel driving circuit includes a plurality of transistors.

The scan driving circuit and/or the data driving circuit are/is formed through the same process as the pixels. Accordingly, the driving circuits also include a plurality of transistors.

SUMMARY

An exemplary embodiment of the present inventive concept provides a display device comprising: a display panel comprising a plurality of pixels, a first pixel of the pixels comprising: a light emitting diode; a capacitor connected between a first voltage line and a reference node; a first transistor connected between the first voltage line and a first electrode of the light emitting diode; a second transistor connected between a data line and a source of the first transistor; a third transistor connected between the reference node and a drain of the first transistor; a fourth transistor connected between the reference node and a second voltage line; a fifth transistor connected between the first voltage line and the source of the first transistor; a sixth transistor connected between the first electrode of the light emitting diode and the drain of the first transistor; and a seventh transistor connected between the second voltage line and the first electrode of the light emitting diode, each of the third transistor and the fourth transistor comprising: an active area comprising a metal oxide; first and second gates disposed on a first side of the active area; and a pattern disposed on a second side of the active area and overlapping the active area.

Each of the first transistor, the second transistor, the fifth transistor, and the sixth transistor is a P-type transistor, and each of the third transistor and the fourth transistor is an N-type transistor.

An active area of each of the first transistor, the second transistor, the fifth transistor, and the sixth transistor comprises polysilicon.

The source of the first transistor extends from the active area of the first transistor.

The pattern of each of the third and fourth transistors comprises a metal.

The pattern of each of the third and fourth transistors comprises polysilicon.

The pattern of each of the third and fourth transistors comprises a conductive material, and a source of the third transistor is electrically connected to the pattern of the third transistor or a source of the fourth transistor is electrically connected to the pattern of the fourth transistor.

The pattern of each of the third and fourth transistors comprises a conductive material, and the first and second gates of the third transistor are electrically connected to the pattern of the third transistor or the first and second gates of the fourth transistor are electrically connected to the pattern of the fourth transistor.

The display device further comprises a semiconductor pattern disposed under the pattern of each of the third and fourth transistors and overlapping the active area of the third transistor.

An active area of the first transistor comprises polysilicon, and the semiconductor pattern extends from the active area of the first transistor.

The seventh transistor comprises: an active area comprising a metal oxide; a gate disposed on a first side of the active area; and a pattern disposed on a second side of the active area.

Each of the first transistor, the second transistor, the fifth transistor, and the sixth transistor is a P-type transistor, and each of the third transistor, the fourth transistor, and the seventh transistor is an N-type transistor.

The second voltage line and the pattern of each of the third and fourth transistors are disposed on a same layer and comprise a same material.

An exemplary embodiment of the present inventive concept provides a display device comprising: a display panel comprising a pixel, the pixel comprising: a light emitting diode; a capacitor connected between a first voltage line and a reference node; a first transistor connected between the first voltage line and a first electrode of the light emitting diode; a second transistor connected between a data line and a source of the first transistor; a third transistor connected between the reference node and a drain of the first transistor; a fourth transistor connected between the reference node and a second voltage line; a fifth transistor connected between the first voltage line and the source of the first transistor; a sixth transistor connected between the first electrode of the light emitting diode and the drain of the first transistor, and a seventh transistor connected between the second voltage line and the first electrode of the light emitting diode, each of the third transistor and the fourth transistor comprising: an active area comprising a metal oxide; a gate disposed above the active area; and a first pattern comprising polysilicon, disposed under the active area, and overlapping the active area when viewed in a plan view, wherein the first pattern of the fourth transistor extends from the first pattern of the third transistor.

The first pattern of the third transistor extends from an active area of the first transistor.

The active area of the fourth transistor extends from the active area of the third transistor.

Each of the third transistor and the fourth transistor further comprises a second pattern disposed between its active area and its first pattern.

The second voltage line and the second pattern are disposed on a same layer and comprise a same metal.

The second pattern of the third transistor at least overlaps the first pattern of the third transistor when viewed in a plan view.

Each of the first transistor, the second transistor, the fifth transistor, and the sixth transistor is a P-type transistor, and each of the third transistor and the fourth transistor is an N-type transistor.

An exemplary embodiment of the present inventive concept provides a display device comprising: a display panel comprising a pixel, the pixel comprising: a light emitting diode; a capacitor connected between a first voltage line receiving a first power source voltage and a reference node; a first transistor connected between the first voltage line and a first electrode of the light emitting diode; a second transistor connected between a data line and a source of the first transistor; a third transistor connected between the reference node and a drain of the first transistor; a fourth transistor connected between the reference node and a second voltage line receiving an initialization voltage; a fifth transistor connected between the first voltage line and the source of the first transistor; a sixth transistor connected between the first electrode of the light emitting diode and the drain of the first transistor; and a seventh transistor connected between the second voltage line and the first electrode of the light emitting diode, each of the third transistor and the fourth transistor comprising: an active layer comprising a metal oxide; a gate disposed above the active layer; and a pattern disposed under the active layer and overlapping the active layer when viewed in a plan view, the first transistor comprising: an active layer comprising polysilicon; and a gate disposed above the active layer of the first transistor, wherein the active layer of the first transistor is disposed lower than the active layer of each of the third transistor and the fourth transistor.

BRIEF DESCRIPTION OF THE DRAWINGS

The above and other features of the present inventive concept will become more apparent by describing in detail exemplary embodiments thereof with reference to the accompanying drawings wherein:

FIGS. 4A and 4B are cross-sectional views showing a display panel corresponding to a pixel according to an exemplary embodiment of the present inventive concept;

DETAILED DESCRIPTION OF THE EMBODIMENTS

Figure 1:
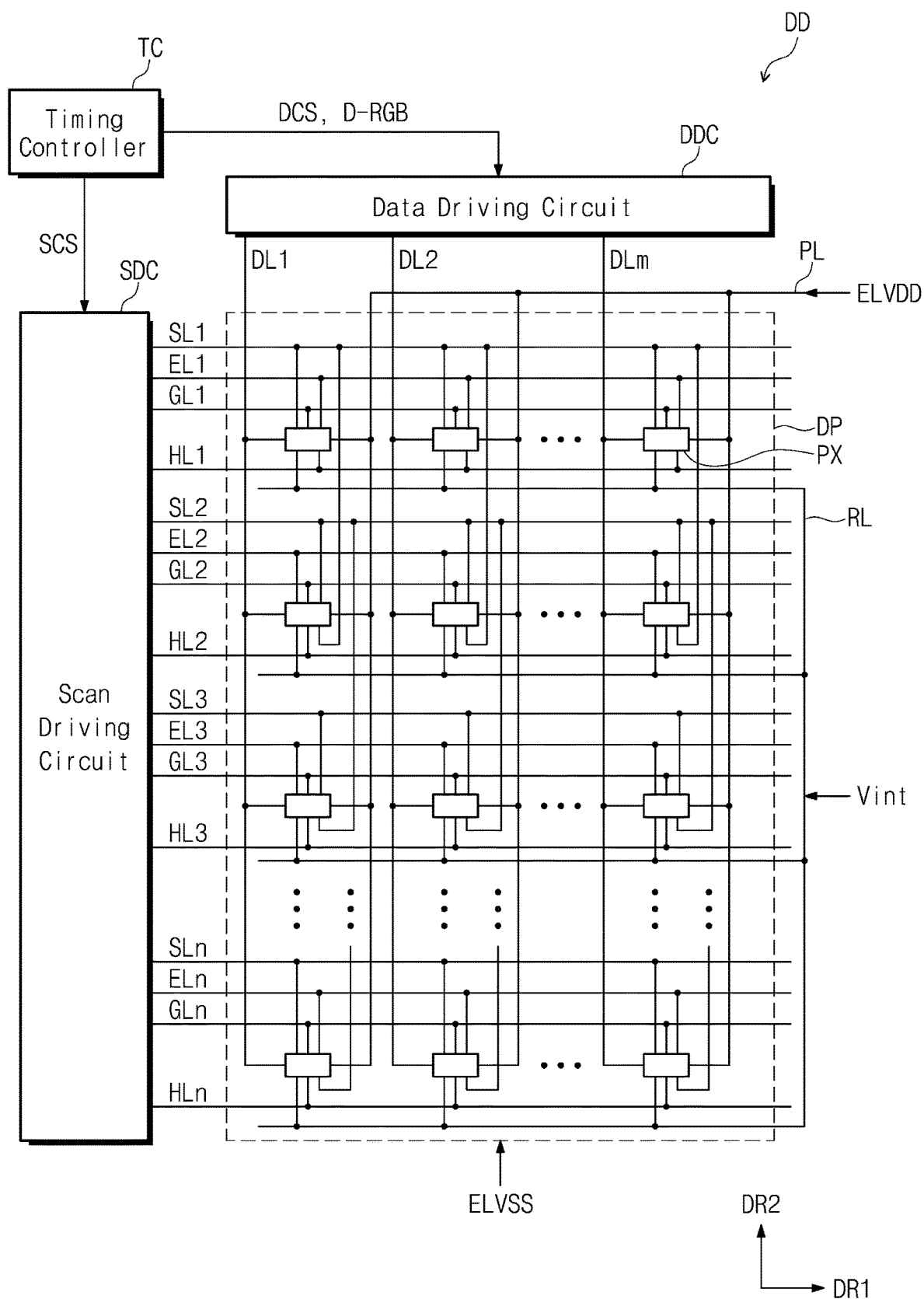
FIG. 1 is a block diagram showing a display device according to an exemplary embodiment of the present inventive concept.

In the specification, it will be understood that when an element or layer is referred to as being "on", "connected to" or "coupled to" another element or layer, it can be directly on, connected or coupled to the other element or layer or intervening elements or layers may be present.

Like numerals may refer to like elements throughout the drawings. In the drawings, the thickness of layers, films and regions may be exaggerated for clarity.

As used herein, the singular forms, "a", "an" and "the" are intended to include the plural forms as well, unless the context clearly indicates otherwise.

Hereinafter, exemplary embodiments of the present inventive concept will be described with reference to the accompanying drawings.

FIG. 1 is a block diagram showing a display device DD according to an exemplary embodiment of the present inventive concept. The display device DD includes a timing controller TC, a scan driving circuit SDC, a data driving circuit DDC, and a display panel DP. In the present exemplary embodiment, the display panel DP will be described as a light emitting type display panel. The light emitting type display panel may include an organic light emitting display panel or a quantum dot light emitting display panel.

The timing controller TC receives input image signals, converts a data format of the input image signals to a data format appropriate for an interface between the timing controller TC and the data driving circuit DDC, and generates image data D-RGB. The timing controller TC outputs the image data D-RGB and various control signals DCS and SCS.

The scan driving circuit SDC receives a scan control signal SCS from the timing controller TC. The scan control signal SCS includes a vertical start signal to start an operation of the scan driving circuit SDC and a clock signal to determine an output timing of signals output from the scan driving circuit SDC. The scan driving circuit SDC generates a plurality of scan signals and sequentially outputs the scan signals to corresponding signal lines SL1 to SLn and GL1 to GLn. In addition, the scan driving circuit SDC generates a plurality of light emitting control signals in response to the scan control signal SCS and outputs the light emitting control signals to corresponding signal lines EL1 to ELn.

In FIG. 1, the scan signals and the light emitting control signals are output from one scan driving circuit SDC, however, the present inventive concept is not limited thereto.

For example, a plurality of scan driving circuits may generate and output the scan signals after dividing the scan signals and may generate and output the light emitting control signals after dividing the light emitting control signals. In addition, in an exemplary embodiment of the present inventive concept, the scan driving circuit that generates and outputs the scan signals may be separately provided from the scan driving circuit that generates and outputs the light emitting control signals.

The data driving circuit DDC receives a data control signal DCS and the image data D-RGB from the timing controller TC. The data driving circuit DDC converts the image data D-RGB to data signals and outputs the data signals to a plurality of data lines DL1 to DLm. The data signals are analog voltages corresponding to grayscale values of the image data D-RGB.

The light emitting display panel DP includes a first group of scan lines SL1 to SLn, a second group of scan lines GL1 to GLn, a third group of scan lines HL1 to HLn, light emitting lines EL1 to ELn, the data lines DL to DLm, a first voltage line PL, a second voltage line RL, and a plurality of pixels PX. The first group of scan lines SL1 to SLn, the second group of scan lines GL1 to GLn, the third group of scan lines HL1 to HLn, and the light emitting lines EL1 to ELn extend in a first direction DR1 and are arranged in a second direction DR2.

The data lines DL1 to DLm are insulated from the first group of scan lines SL1 to SLn, the second group of scan lines GL1 to GLn, the third group of scan lines HL1 to HLn, and the light emitting lines EL1 to ELn while crossing the first group of scan lines SL1 to SLn, the second group of scan lines GL1 to GLn, the third group of scan lines HL1 to HLn, and the light emitting lines EL1 to ELn. Each of the pixels PX is connected to corresponding signal lines among the signal lines. A connection relationship between the pixels PX and the signal lines may be changed depending on a configuration of the driving circuit of the pixels PX.

The first voltage line PL receives a first power source voltage ELVDD. The second voltage line RL receives an initialization voltage Vint. The initialization voltage Vint has a level lower than that of the first power source voltage ELVDD. The display panel DP receives a second power source voltage ELVSS. The second power source voltage ELVSS has a level lower than that of the first power source voltage ELVDD.

In the above-descriptions, the display device DD according to the present embodiment is described with reference to FIG. 1, however, the display device DD is not be limited thereto. For example, signal lines may be added or omitted depending on the configuration of the pixel driving circuit. In addition, a connection relationship between one pixel PX and the signal lines may be changed.

The pixels PX may include a plurality of groups generating different color lights from each other. For instance, the pixels PX may include red pixels for generating a red color light, green pixels for generating a green color light, and blue pixels for generating a blue color light. A light emitting diode of the red pixel, a light emitting diode of the green pixel, and a light emitting diode of the blue pixel may include light emitting layers containing different materials from each other.

The pixel driving circuit may include a plurality of transistors and a capacitor electrically connected to the transistors. At least one of the scan driving circuit SDC and the data driving circuit DDC may include a plurality of transistors formed through the same process as the pixel driving circuit.

The above-mentioned signal lines, the pixels PX, the scan driving circuit SDC, and the data driving circuit DDC may be formed on a base substrate through multiple photolithography processes. A plurality of insulating layers may be formed on the base substrate through multiple deposition processes or coating processes. The insulating layers may be thin layers corresponding to the pixels PX, and a portion of the insulating layers may include an insulating pattern overlapping only a specific conductive pattern. The insulating layers may include an organic layer and/or an inorganic layer.

Figure 2:
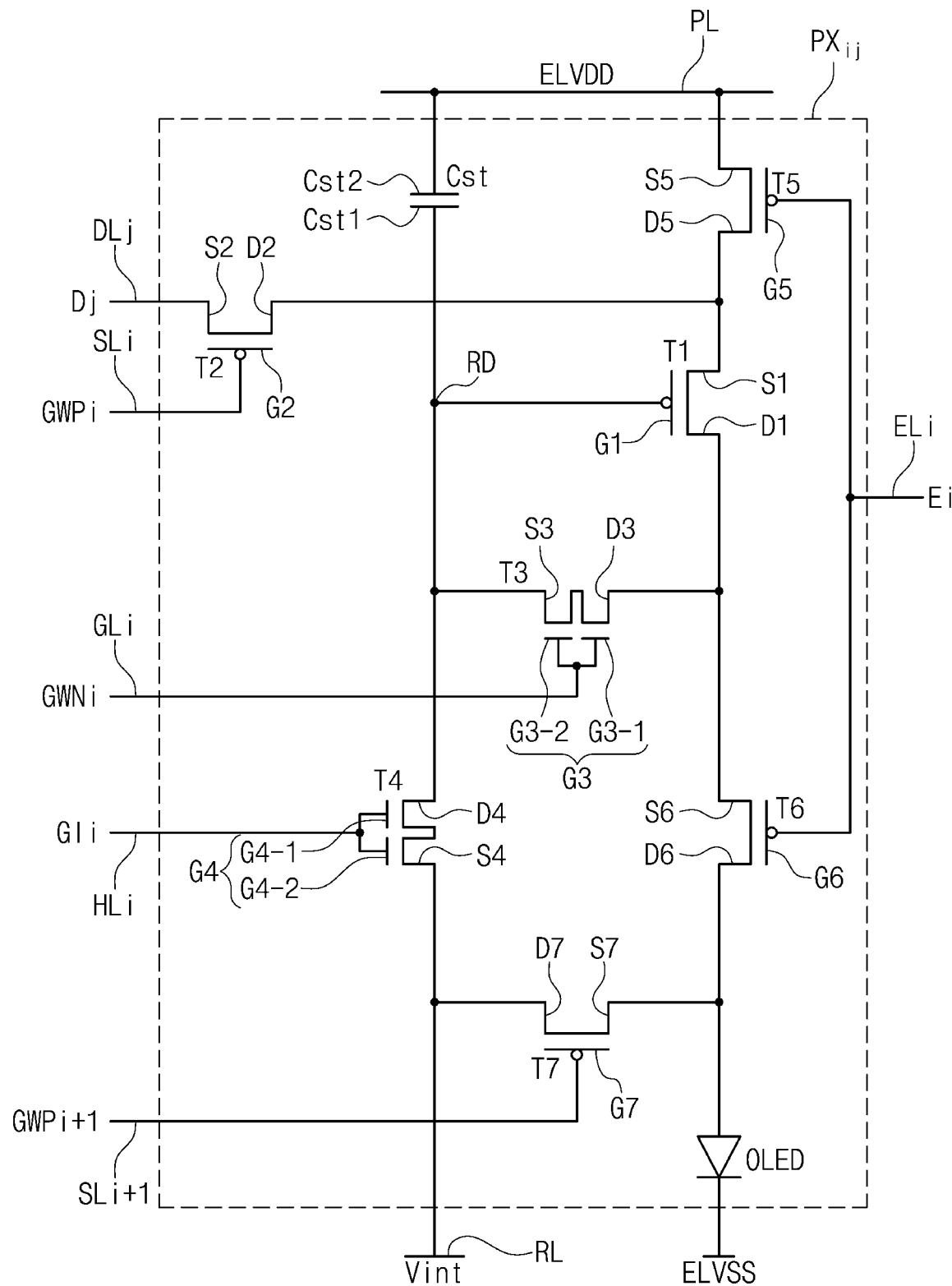
FIG. 2 is an equivalent circuit diagram showing a pixel according to an exemplary embodiment of the present inventive concept.
Figure 3:
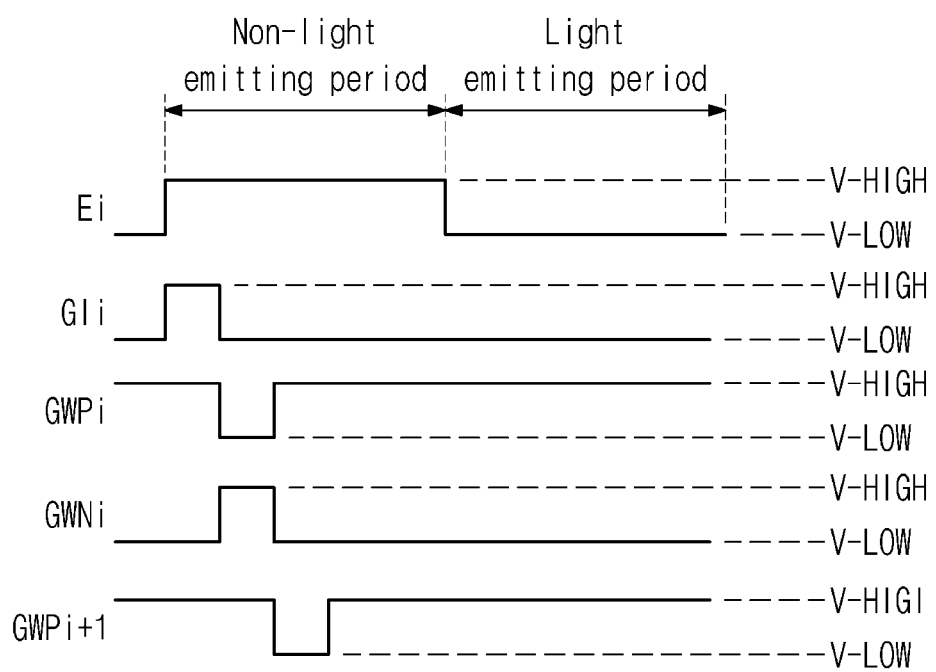
FIG. 3 is a waveform diagram showing driving signals used to drive the pixel shown in FIG. 2.

FIG. 2 is an equivalent circuit diagram showing a pixel PXij according to an exemplary embodiment of the present inventive concept. FIG. 3 is a waveform diagram showing driving signals used to drive the pixel PXij shown in FIG. 2.

FIG. 2 shows the pixel PXij connected to an i-th scan line SLi among the first group of scan lines SL1 to SLn and connected to a j-th data line DLj among the data lines DL1 to DLm as a representative example.

In the present exemplary embodiment, the pixel driving circuit may include first, second, third, fourth, fifth, sixth, and seventh transistors T1, T2, T3, T4, T5, T6, and T7 and a capacitor Cst. In the present exemplary embodiment, the first transistor T1, the second transistor T2, the fifth transistor T5, the sixth transistor T6, and the seventh transistor T7 are a P-type transistor, and the third transistor T3 and the fourth transistor T4 are an N-type transistor. However, the first to seventh transistors T1 to T7 are not limited thereto, and the first to seventh transistors T1 to T7 may be implemented in one of the p-type transistor and the n-type transistor. In addition, in the present exemplary embodiment, at least one of the first to seventh transistors T1 to T7 may be omitted.

In the present exemplary embodiment, the first transistor T1 may be a driving transistor, and the second transistor T2 may be a switching transistor. The capacitor Cst is connected between the first voltage line PL receiving the first power source voltage ELVDD and a reference node RD. The capacitor Cst includes a first electrode Cst1 connected to the reference node RD and a second electrode Cst2 connected to the first voltage line PL.

The first transistor T1 is connected between the first voltage line PL and a first electrode (e.g., an anode) of a light emitting diode OLED. A source S1 of the first transistor T1 is electrically connected to the first voltage line PL. In the following descriptions, the expression "a transistor is electrically connected to a signal line" may mean that a source, drain, or gate of a transistor is provided integrally with a signal line or is connected to a signal line through a connection electrode. In addition, the expression "a transistor is electrically connected to a transistor" may mean that a source, drain, or gate of one transistor is provided integrally with a source, drain, or gate of another transistor or is connected to a source, drain, or gate of another transistor through a connection electrode. Another transistor may be disposed or omitted between the source S1 of the first transistor T1 and the first voltage line PL.

A drain D1 of the first transistor T1 is electrically connected to the anode of the light emitting diode OLED. Another transistor may be disposed or omitted between the drain D1 of the first transistor T1 and the anode of the light emitting diode OLED. A gate G1 of the first transistor T1 is electrically connected to the reference node RD.

The second transistor T2 is connected between the j-th data line DLj and the source S1 of the first transistor T1. A source S2 of the second transistor T2 is electrically connected to the j-th data line DLj, and a drain D2 of the second transistor T2 is electrically connected to the source S1 of the first transistor T1. In the present exemplary embodiment, a gate G2 of the second transistor T2 may be electrically connected to the i-th scan line SLi of the first group.

The third transistor T3 is connected between the reference node RD and the drain D1 of the first transistor T1. A drain D3 of the third transistor T3 is electrically connected to the drain D1 of the first transistor T1, and a source S3 of the third transistor T3 is electrically connected to the reference node RD. The third transistor T3 may include a plurality of gates. In the present exemplary embodiment, two gates G3-1 and G3-2 of the third transistor T3 may be electrically connected to an i-th scan line GLi of the second group. In another exemplary embodiment of the present inventive concept, the third transistor T3 may include a single gate.

The fourth transistor T4 is connected between the reference node RD and the second voltage line RL. A drain D4 of the fourth transistor T4 is electrically connected to the reference node RD, and a source S4 of the fourth transistor T4 is electrically connected to the second voltage line RL. The fourth transistor T4 may include a plurality of gates. In another exemplary embodiment of the present inventive concept, the fourth transistor T4 may include a single gate.

In the present exemplary embodiment, two gates G4-1 and G4-2 of the fourth transistor T4 may be electrically connected to an i-th scan line HLi of the third group. Since the third transistor T3 and the fourth transistor T4 include the plural gates, a leakage current of the pixel PXij may be reduced.

The fifth transistor T5 is connected between the first voltage line PL and the source S of the first transistor T. A source S5 of the fifth transistor 1S is electrically connected to the first voltage line PL, and a drain D5 of the fifth transistor T5 is electrically connected to the source S1 of the first transistor T1. A gate G5 of the fifth transistor T5 may be electrically connected to an i-th light emitting line ELi.

The sixth transistor T6 is connected between the drain D1 of the first transistor T1 and the light emitting diode OLED. A source S6 of the sixth transistor T6 is electrically connected to the drain D1 of the first transistor T1, and a drain D6 of the sixth transistor T6 is electrically connected to the anode of the light emitting diode OLED. A gate G6 of the sixth transistor T6 may be electrically connected to the i-th light emitting line ELi. In an exemplary embodiment of the present inventive concept, the gate G6 of the sixth transistor T6 may be connected to a signal line different from a signal line to which the gate G5 of the fifth transistor T5 is connected.

The seventh transistor T7 is connected between the drain D6 of the sixth transistor T6 and the second voltage line RL. A source S7 of the seventh transistor T7 is electrically connected to the drain D6 of the sixth transistor T6, and a drain D7 of the seventh transistor T7 is electrically connected to the second voltage line RL. A gate G7 of the seventh transistor T7 may be electrically connected to an (i+1)th scan line SLi+1 of the first group.

The operation of the pixel PXij will be described in more detail with reference to FIGS. 2 and 3. The display device DD (refer to FIG. 1) displays an image every frame period. The signal lines of each of the first group of scan lines SLi to SLn, the second group of scan lines GL1 to GLn, the third group of scan lines HL1 to HLn, and the light emitting lines EL1 to ELn are sequentially scanned during each frame period. FIG. 3 shows a portion of one frame period.

Referring to FIG. 3, each of signals Ei, Gli, GWPi, GWNi, and GWPi+1 may have a high level V-HIGH for a portion of the period and may have a low level V-LOW for another portion of the period. The n-type transistors are turned on when a corresponding signal has the high level V-HIGH, and the p-type transistors are turned on when a corresponding signal has the low level V-LOW.

When the light emitting control signal Ei has the high level V-HIGH, the fifth transistor T5 and the sixth transistor T6 are turned off. When the fifth transistor T5 and the sixth transistor T6 are turned off, a current path is not formed between the first voltage line PL and the light emitting diode OLED. Accordingly, the period during which the current path is not formed may be a non-light emitting period.

When a first scan signal Gli applied to the i-th scan line HLi of the third group has the high level V-HIGH, the fourth transistor T4 is turned on. When the fourth transistor T4 is turned on, the reference node RD is initialized by the initialization voltage Vint.

When a second scan signal GWPi applied to the i-th scan line SLi of the first group has the low level V-LOW and a third scan signal GWNi applied to the i-th scan line GLi of the second group has the high level V-HIGH, the second transistor T2 and the third transistor T3 are turned on.

Since the reference node RD is initialized to the initialization voltage Vint, the first transistor T1 is in a turned-on state. When the first transistor T1 is turned on, a voltage corresponding to the data signal Dj (refer to FIG. 2) is applied to the reference node RD. In this case, the capacitor Cst is charged with the voltage corresponding to the data signal Dj.

When a fourth scan signal GWPi+1 applied to the (i+1)th scan line SLi+1 of the first group has the low level V-LOW, the seventh transistor T7 is turned on. As the seventh transistor 7 is turned on, the anode of the light emitting diode OLED is initialized to the initialization voltage Vint. A parasitic capacitance of the light emitting diode OLED may be discharged.

When the light emitting control signal Ei has the low level V-LOW, the fifth transistor T5 and the sixth transistor T6 are turned on. When the fifth transistor T5 is turned on, the first power source voltage ELVDD is applied to the first transistor T1. When the sixth transistor T6 is turned on, the first transistor T and the light emitting diode OLED are electrically connected to each other. The light emitting diode OLED generates light having brightness corresponding to an amount of current applied thereto.

Figure 4B:
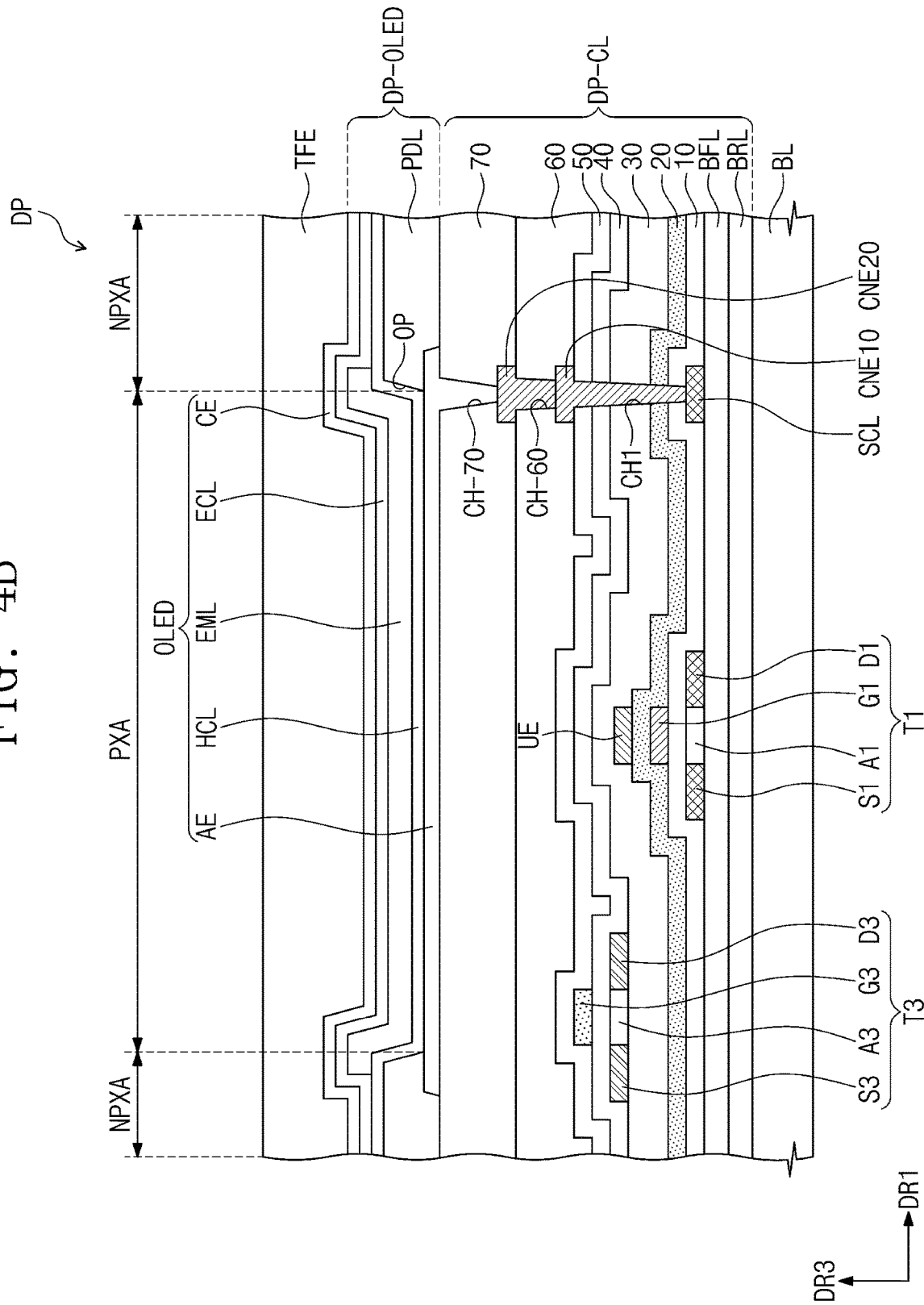

FIGS. 4A and 4B are cross-sectional views showing the display panel DP corresponding to a pixel according to an exemplary embodiment of the present inventive concept. FIGS. 4A and 4B show cross sections of portions corresponding to the first and third transistors T1 and T3 shown in FIG. 2.

Referring to FIGS. 4A and 4B, the display panel DP may include a base layer BL, a circuit element layer DP-CL, a display element layer DP-OLED, and a thin film encapsulation layer TFE, which are disposed on the base layer BL. The display panel DP may further include functional layers, such as an anti-reflective layer, and a refractive index control layer. The circuit element layer DP-CL includes at least a plurality of insulating layers and a circuit element. Hereinafter, the insulating layers may include an organic layer and/or an inorganic layer.

An insulating layer, a semiconductor layer, and a conductive layer are formed by coating and deposition processes. Then, the insulating layer, the semiconductor layer, and the conductive layer are selectively patterned by a photolithography process. A semiconductor pattern, a conductive pattern, and at least one of the signal lines are formed by the above-mentioned method.

The base layer BL may include a synthetic resin film. The synthetic resin film may include a heat-curable resin. In particular, the synthetic resin film (or, a synthetic resin layer) may be a polyimide-based resin layer, but it is not limited thereto. The synthetic resin layer may include at least one of an acrylic-based resin, a methacrylic-based resin, a polyisoprene, a vinyl-based resin, an epoxy-based resin, a urethane-based resin, a cellulose-based resin, a siloxane-based resin, a polyamide-based resin, and a perylene-based resin. Further, the base layer BL may include a glass substrate, a metal substrate, or an organic/inorganic composite substrate.

At least one inorganic layer is formed on an upper surface of the base layer BL. The inorganic layer may include at least one of aluminum oxide, titanium oxide, silicon oxide, silicon oxynitride, zirconium oxide, and hafnium oxide. The inorganic layer may be provided in a plural number. The inorganic layers may form a barrier layer BRL and/or a buffer layer BFL. The barrier layer BRL and the buffer layer BFL may be selectively disposed. For example, the barrier layer BRL may be disposed between the buffer layer BFL and the base layer BL.

The barrier layer BRL may prevent a foreign substance from entering from the outside. The barrier layer BRL may include a silicon oxide layer and a silicon nitride layer. Each of the silicon oxide layer and the silicon nitride layer may be provided in a plural number, and the silicon oxide layers and the silicon nitride layers may be alternately stacked with each other.

The buffer layer BFL may be disposed on the barrier layer BRL. The buffer layer BFL may increase a coupling force between the base layer BL and the semiconductor pattern and/or the conductive pattern. The buffer layer BFL may include a silicon oxide layer and a silicon nitride layer. The silicon oxide layer and the silicon nitride layer may be alternately stacked with each other.

The semiconductor pattern is disposed on the buffer layer BFL. The semiconductor pattern directly disposed on the buffer layer BFL may be a first semiconductor pattern. The first semiconductor pattern may include a silicon semiconductor. The first semiconductor pattern may include polysilicon, however, it is not limited thereto. The first semiconductor pattern may include an amorphous silicon.

FIGS. 4A and 4B show only a portion of the first semiconductor pattern, and the first semiconductor pattern may be further disposed in another area of the pixel PXij (refer to FIG. 2). The first semiconductor pattern may have different electrical properties depending on whether it is doped or not. The first semiconductor pattern may include a doped area and a non-doped area. In other words, the first semiconductor pattern may include a first area and a second area. The doped area may be doped with an N-type dopant or a P-type dopant. The P-type transistor includes the doped area doped with the P-type dopant. The N-type transistor includes the doped area doped with the N-type dopant.

The doped area has a conductivity greater than that of the non-doped area and acts as an electrode or a signal line. The non-doped area corresponds to an active area (or a channel or active layer or active pattern) of the transistor. In other words, a first portion of the first semiconductor pattern may be an active area of the transistor, a second portion of the first semiconductor pattern may be a source or drain of the transistor, and a third portion of the first semiconductor pattern may be a connection signal line (or a connection electrode).

As illustrated in FIGS. 4A and 4B, the source S, an active area A1, and the drain D1 of the first transistor T1 are formed from the first semiconductor pattern. The source S1 and the drain D1 of the first transistor T1 extend in opposite directions with respect to each other from the active area A1.

FIGS. 4A and 4B show a portion of the connection signal line SCL formed from the semiconductor pattern. The connection signal line SCL may be connected to the drain D6 of the sixth transistor T6 (refer to FIG. 2) when viewed in a plan view.

A first insulating layer 10 is disposed on the buffer layer BFL. The first insulating layer 10 commonly overlaps the pixels PX (refer to FIG. 1) and covers the first semiconductor pattern. The first insulating layer 10 may include an inorganic layer and/or an organic layer and may have a single-layer or multi-layer structure. The first insulating layer 10 may include at least one of aluminum oxide, titanium oxide, silicon oxide, silicon oxynitride, zirconium oxide, and hafnium oxide. In the present exemplary embodiment, the first insulating layer 10 may be a silicon oxide layer having a single-layer structure. An insulating layer of the circuit element layer DP-CL described later may include an inorganic layer and/or an organic layer and may have a single-layer or multi-layer structure as well as the first insulating layer 10. The inorganic layer may include at least one of the above-mentioned materials.

The gate G1 of the first transistor T1 is disposed on the first insulating layer 10. The gate G1 may be a portion of a metal pattern. The gate G1 of the first transistor T1 overlaps the active area A1 of the first transistor T1. The gate G1 of the first transistor T1 acts as a mask in a doping process of the first semiconductor pattern.

A second insulating layer 20 is disposed on the first insulating layer 10 to cover the gate G1. The second insulating layer 20 commonly overlaps the pixels PX (refer to FIG. 1). The second insulating layer 20 may include an inorganic layer and/or an organic layer and may have a single-layer or multi-layer structure. In the present exemplary embodiment, the second insulating layer 20 may be a silicon oxide layer having a single-layer structure.

An upper electrode UE may be disposed on the second insulating layer 20. The upper electrode UE may overlap the gate G1. The upper electrode UE may be a portion of the metal pattern or a portion of the doped semiconductor pattern. A portion of the gate G1 and the upper electrode UE overlapping the portion of the gate G1 may be the capacitor Cst (refer to FIG. 2). In an exemplary embodiment of the present inventive concept, the upper electrode UE may be omitted.

In an exemplary embodiment of the present inventive concept, the second insulating layer 20 may be replaced with an insulating pattern. The upper electrode UE is disposed on the insulating pattern. The upper electrode UE may act as a mask used to form the insulating pattern from the second insulating layer 20.

The first electrode Cst1 and the second electrode Cst2 of the capacitor Cst (refer to FIG. 2) may be formed through the same process as the gate G1 and the upper electrode UE. The first electrode Cst1 may be disposed on the first insulating layer 10. The first electrode Cst1 may be electrically connected to the gate G1. The first electrode Cst1 may be provided integrally with the gate G1.

The second electrode Cst2 may be disposed on the second insulating layer 20. The second electrode Cst2 may be electrically connected to the upper electrode UE. The second electrode Cst2 may be provided integrally with the upper electrode UE.

A third insulating layer 30 is disposed on the second insulating layer 20 to cover the upper electrode UE. In the present exemplary embodiment, the third insulating layer 30 may be a silicon oxide layer having a single-layer structure. The sources S2, S5, S6, and S7 (refer to FIG. 2), the drains D2, D5, D6, and D7 (refer to FIG. 2), and the gates G2, G5, G6, and G7 (refer to FIG. 2) of the second, fifth, sixth, and seventh transistors T2, T5, T6, and T7 (refer to FIG. 2) may be formed through the same processes as the source S1, the drain D1, and the gate G1 of the first transistor T1, respectively.

The semiconductor pattern is disposed on the third insulating layer 30. Hereinafter, the semiconductor pattern directly disposed on the third insulating layer 30 is referred to as a "second semiconductor pattern". The second semiconductor pattern may include a metal oxide. An oxide semiconductor may include a crystalline or amorphous oxide semiconductor. For example, the oxide semiconductor may include a metal oxide of zinc (Zn), indium (In), gallium (Ga), tin (Sn), and titanium (Ti), or a mixture of a metal, such as zinc (Zn), indium (In), gallium (Ga) tin (Sn), and titanium (Ti) and oxides thereof. The oxide semiconductor may include indium-tin oxide (ITO), indium-gallium-zinc oxide (IGZO), zinc oxide (ZnO), indium-zinc oxide (IZnO), zinc-indium oxide (ZIO), indium oxide (InO), titanium oxide (TiO), indium-zinc-tin oxide (IZTO), or zinc-tin oxide (ZTO).

FIGS. 4A and 4B show only a portion of the second semiconductor pattern, and the second semiconductor pattern may be further disposed in another area of the pixel PXij (refer to FIG. 2). The second semiconductor pattern may include a plurality of areas distinguished from each other depending on whether the metal oxide is reduced. The area (hereinafter, referred to as a "reduced area") in which the metal oxide is reduced has a conductivity greater than that of the area (hereinafter, referred to as a "non-reduced area") in which the metal oxide is not reduced. The reduced area acts as the electrode or the signal line. The non-reduced area corresponds to the active area (or the channel) of the transistor. In other words, a first portion of the second semiconductor pattern may be the active area of the transistor, a second portion of the second semiconductor pattern may be the source or drain of the transistor, and a third portion of the second semiconductor pattern may be the connection electrode or the connection signal line.

As illustrated in FIGS. 4A and 4B, the source S3, an active area A3, and the drain D3 of the third transistor T3 are formed from the second semiconductor pattern. The source S3 and the drain D3 of the third transistor T3 include a metal reduced from the metal oxide semiconductor. The source S3 and the drain D3 may include a metal layer having a predetermined thickness from an upper surface of the second semiconductor pattern and including the reduced metal.

A fourth insulating layer 40 is disposed on the third insulating layer 30 to cover the second semiconductor pattern. In the present exemplary embodiment, the fourth insulating layer 40 may be a silicon oxide layer having a single-layer structure. The gate G3 of the third transistor T3 is disposed on the fourth insulating layer 40. The gate G3 may be a portion of the metal pattern. The gate G3 of the third transistor T3 overlaps the active area A3 of the third transistor T3.

In an exemplary embodiment of the present inventive concept, the fourth insulating layer 40 may be replaced with an insulating pattern. The gate G3 of the third transistor T3 is disposed on the insulating pattern. In the present exemplary embodiment, the gate G3 may have substantially the same shape as the insulating pattern when viewed in a plan view. In the present exemplary embodiment, for the convenience explanation, one gate G3 is shown, however, the third transistor T3 may include two gates G3-1 and G3-2 as shown in FIG. 2.

A fifth insulating layer 50 is disposed on the fourth insulating layer 40 to cover the gate G3. In the present exemplary embodiment, the fifth insulating layer 50 may include a silicon oxide layer and a silicon nitride layer. The fifth insulating layer 50 may include silicon oxide layers and silicon nitride layers alternately stacked with the silicon oxide layers.

The source S4 (refer to FIG. 2), the drain D4 (refer to FIG. 2), and the gate G4 (refer to FIG. 2) of the fourth transistor T4 (refer to FIG. 2) may be formed through the same processes as the source S3, the drain D3, and the gate G3 of the third transistor T3, respectively.

At least one insulating layer is further disposed on the fifth insulating layer 50. In the present exemplary embodiment, a sixth insulating layer 60 and a seventh insulating layer 70 may be disposed on the fifth insulating layer 50. The sixth insulating layer 60 and the seventh insulating layer 70 may be an organic layer and may have a single-layer or multi-layer structure. The sixth insulating layer 60 and the seventh insulating layer 70 may be a polyimide-based resin layer having a single-layer structure, however, they are not limited thereto. The sixth insulating layer 60 and the seventh insulating layer 70 may include at least one of an acrylic-based resin, a methacrylic-based resin, a polyisoprene, a vinyl-based resin, an epoxy-based resin, a urethane-based resin, a cellulose-based resin, a siloxane-based resin, a polyamide-based resin, and a perylene-based resin.

As shown in FIG. 4A, a first connection electrode CNE1 may be disposed on the sixth insulating layer 60. The first connection electrode CNE1 may be connected to the connection signal line SCL (or the connection electrode) through a first contact hole CH1 passing through the first to sixth insulating layers 10 to 60. The light emitting diode OLED is disposed on the seventh insulating layer 70. The anode AE of the light emitting diode OLED is disposed on the seventh insulating layer 70. A pixel definition layer PDL is disposed on the seventh insulating layer 70. The anode AE is connected to the first connection electrode CNE1 through a contact hole CH-70 passing through the seventh insulating layer 70.

In FIG. 4A, the first connection electrode CNE1 is directly connected to the connection signal line SCL, however, it is not limited thereto. Referring to FIG. 4B, a first connection electrode CNE10 may be disposed on the fifth insulating layer 50. The first connection electrode CNE10 may be connected to the connection signal line SCL through the first contact hole CH1 passing through the first to fifth insulating layers 10 to 50, and a second connection electrode CNE20 may be connected to the first connection electrode CNE10 through a contact hole CH-60 passing through the sixth insulating layer 60. In an exemplary embodiment of the present inventive concept, at least one of the fifth insulating layer 50 and the sixth insulating layer 60 may be omitted.

At least a portion of the anode AE is exposed through an opening OP of the pixel definition layer PDL. The opening OP of the pixel definition layer PDL may define a light emitting area PXA. For instance, the pixels PX (refer to FIG. 1) may be regularly arranged on the plane of the display panel DP (refer to FIG. 1). An area in which the pixels PX are arranged may be referred to as a pixel area, and one pixel area may include the light emitting area PXA and a non-light emitting area NPXA adjacent to the light emitting area PXA. The non-light emitting area NPXA may surround the light emitting area PXA.

A hole control layer HCL may be commonly disposed on the light emitting area PXA and the non-light emitting area NPXA. A common layer such as the hole control layer HCL may be commonly formed in the pixels PX. The hole control layer HCL may include a hole transport layer and may further include a hole injection layer.

A light emitting layer EML may be disposed on the hole control layer HCL. The light emitting layer EML may be disposed in an area corresponding to the opening OP. The light emitting layer EML may be formed in each of the pixels PX after being divided into plural portions.

In the present exemplary embodiment, a patterned light emitting layer EML is shown as a representative example, however, the light emitting layer EML may be commonly disposed in the pixels PX. In this case, the light emitting layer EML may generate a white light or a blue light. In addition, the light emitting layer EML may have a multi-layer structure.

An electron control layer ECL may be disposed on the light emitting layer EML. The electron control layer ECL may include an electron transport layer and an electron injection layer. A cathode CE may be disposed on the electron control layer ECL. The electron control layer ECL and the cathode CE may be commonly disposed in the pixels PX.

The thin film encapsulation layer TFE is disposed on the cathode CE. The thin film encapsulation layer TFE is commonly disposed in the pixels PX. In the present exemplary embodiment, the thin film encapsulation layer TFE directly covers the cathode CE. In an exemplary embodiment of the present inventive concept, a capping layer that directly covers the cathode CE may be further provided. In an exemplary embodiment of the present inventive concept, the stacked structure of the light emitting diode OLED may have a structure that is vertically inverted (e.g., upside down) compared with the structure shown in FIGS. 4A and 4B.

The thin film encapsulation layer TFE includes at least an inorganic layer or an organic layer. In the exemplary embodiment of the present inventive concept, the thin film encapsulation layer TFE may include two inorganic layers and an organic layer disposed between the two inorganic layers. In the exemplary embodiment of the present inventive concept, the thin film encapsulation layer TFE may include a plurality of inorganic layers and a plurality of organic layers alternately stacked with the inorganic layers.

The inorganic layer of the thin film encapsulation layer TFE protects the light emitting diode OLED from moisture and oxygen, and the organic layer of the thin film encapsulation layer TFE protects the light emitting diode OLED from a foreign substance such as dust particles. The inorganic layer of the thin film encapsulation layer TFE may include a silicon nitride layer, a silicon oxynitride layer, a silicon oxide layer, a titanium oxide layer, or an aluminum oxide layer, but it is not limited thereto. The organic layer of the thin film encapsulation layer TFE may include an acrylic-based organic layer, but it is not limited thereto.

Figure 5A:
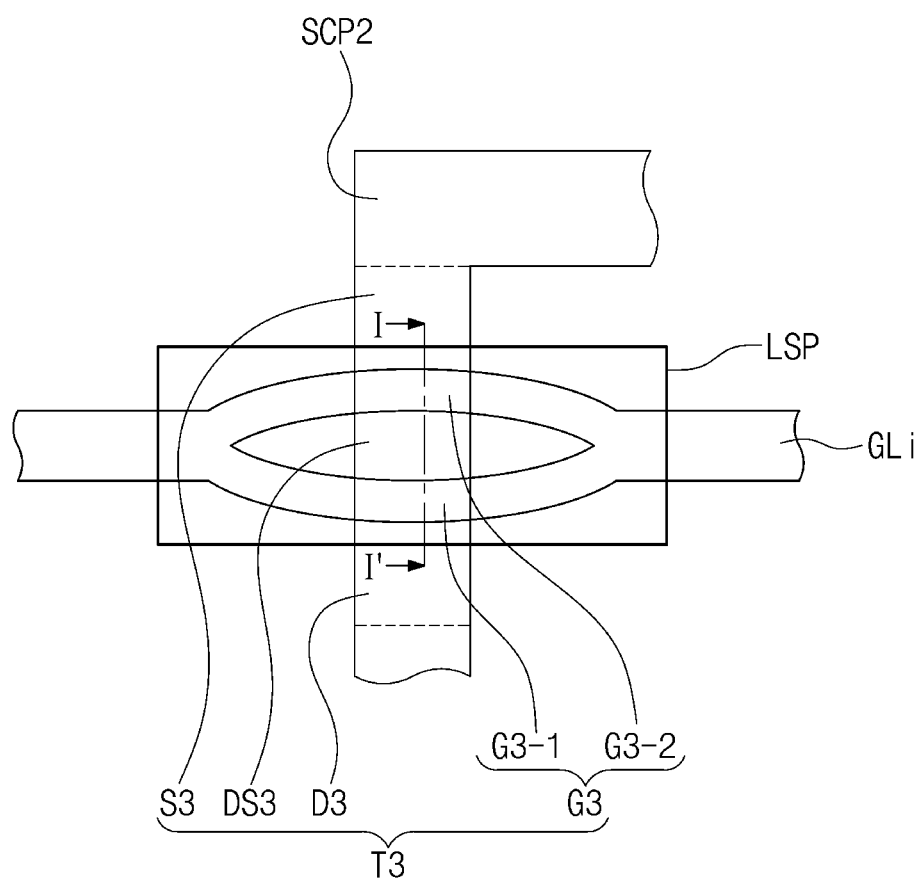
FIG. 5A is a plan view showing a third transistor according to an exemplary embodiment of the present inventive concept.
Figure 5B:
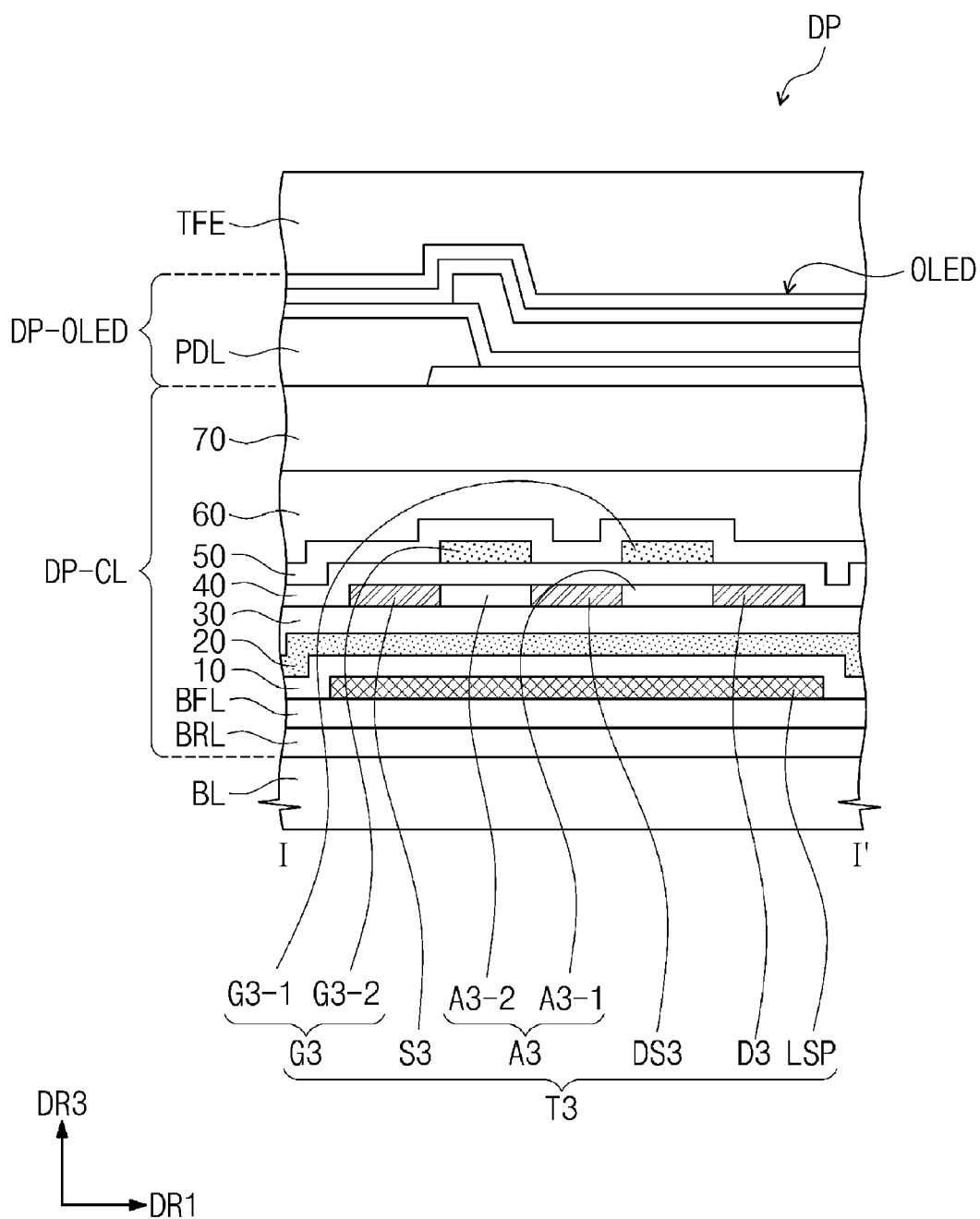
FIGS. 5B, 5C and 5D are cross-sectional views showing the third transistor shown in FIG. 5A.
Figure 5C:
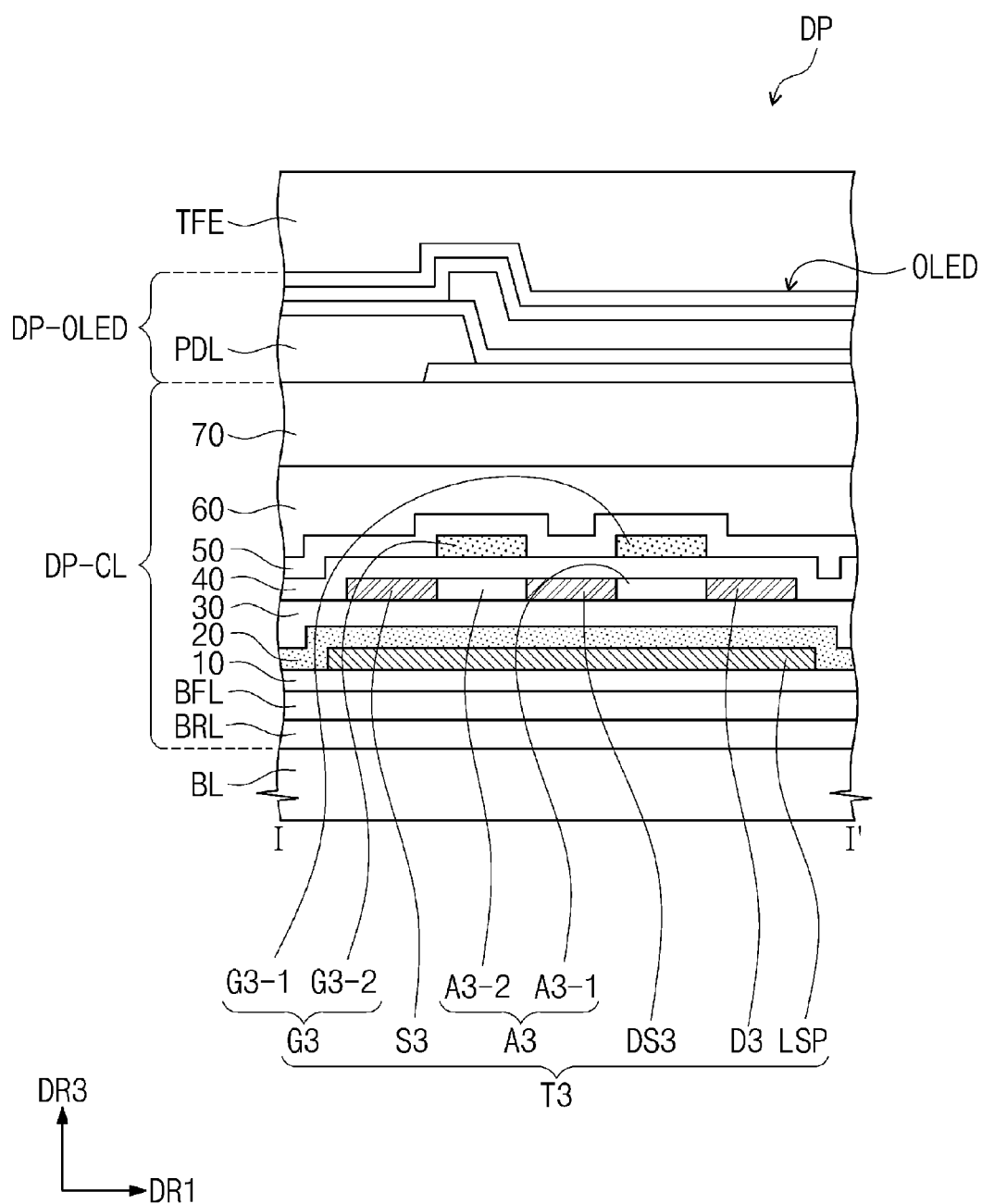
Figure 5D:
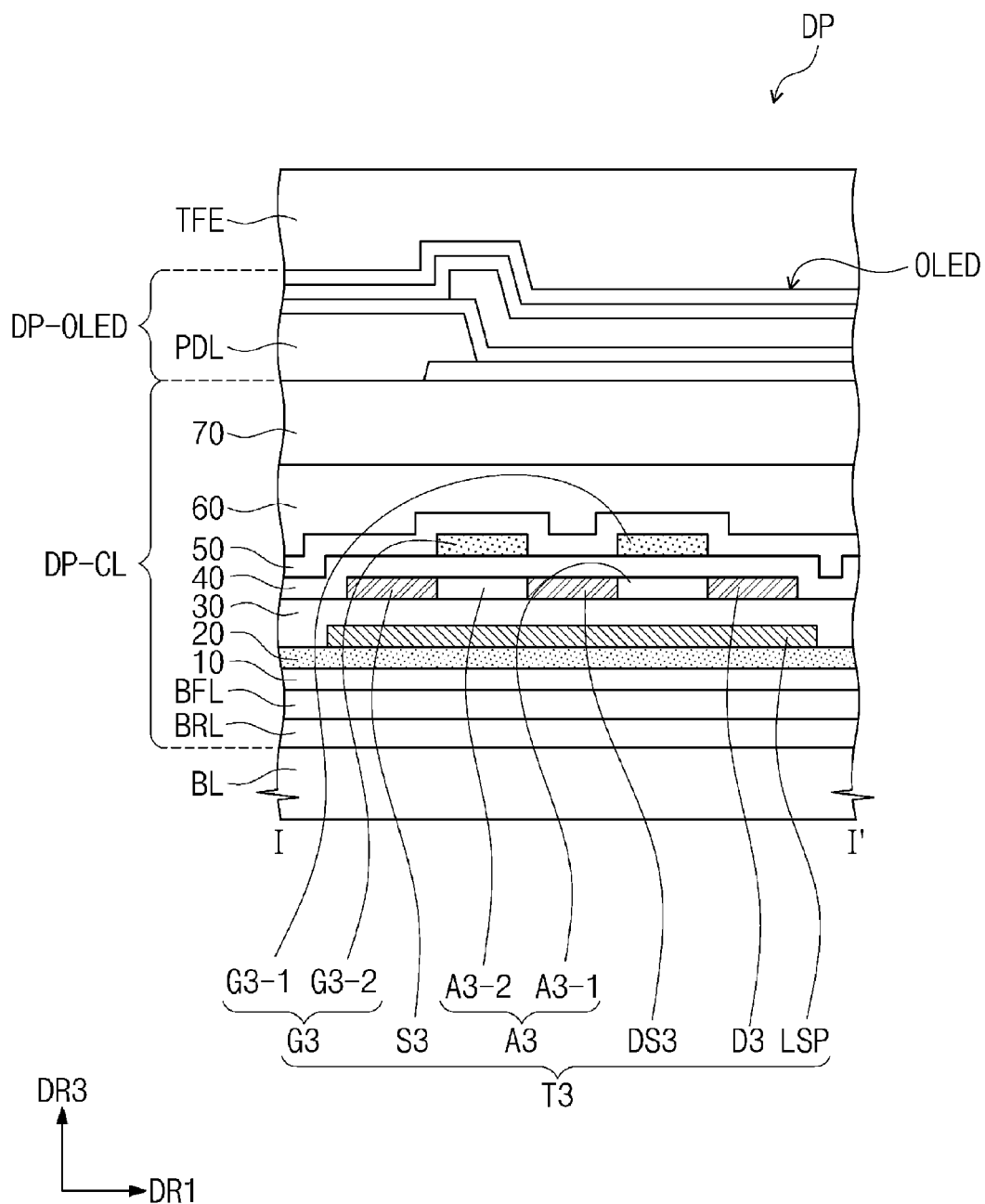

FIG. 5A is a plan view showing a third transistor T3 according to an exemplary embodiment of the present inventive concept. FIGS. 5B to 5D are cross-sectional views showing the third transistor T3 shown in FIG. 5A. Hereinafter, detailed descriptions of the same elements as those described with reference to FIGS. 1 to 4B may be omitted.

Referring to FIGS. 5A and 5D, the third transistor T3 may further include a pattern LSP. The pattern LSP may include a material having a high light absorptivity or a material having a high light reflectivity. The pattern LSP is disposed under the second semiconductor pattern SCP2 to block a light incident into the second semiconductor pattern SCP2, particularly, the active area A3 of the third transistor T3, from the outside. In other words, the pattern LSP may be a light blocking pattern. For example, the pattern LSP can prevent external light from changing a voltage-current characteristic of the active area A3 of the third transistor T3 and from causing a leakage current.

Referring to FIG. 5A, the source S3, the active area A3, and the drain D3 of the third transistor T3 correspond to portions, which are different from each other, of the second semiconductor pattern SCP2. The gate G3 of the third transistor T3 corresponds to a portion of the i-th scan line GLi of the second group.

As shown in FIG. 5B, the pattern LSP may be disposed on the buffer layer BFL. The pattern LSP may include the same material as the source S and the drain D1 of the first transistor T1 (refer to FIG. 4A). The pattern LSP includes a metal.

The pattern LSP and the source S1 and the drain D1 of the first transistor T1 (refer to FIG. 4A) may be formed from the first semiconductor pattern. For example, the pattern LSP may include doped polysilicon. In other words, the pattern LSP may be a semiconductor pattern different from the active area A3 of the third transistor T3. The pattern LSP includes at least polysilicon.

As shown in FIGS. 5A and 5B, the third transistor T3 may include first and second gates G3-1 and G3-2 and first and second active areas A3-1 and A3-2 respectively corresponding to the first and second gates G3-1 and G3-2. For example, the first gate G3-1 may overlap the first active area A3-1 and the second gate G3-2 may overlap the second active area A3-2. An area between the first and second active areas A3-1 and A3-2 corresponds to a drain/source DS3 of the second semiconductor pattern SCP2. In FIG. 5A, the drain/source DS3 is shown to have an oval shape, but is not limited thereto. The third transistor T3 shown in FIGS. 5A and 5B has a circuit configuration in which two transistors are connected in series in an equivalent circuit.

As shown in FIG. 5C, the pattern LSP may be disposed on the first insulating layer 10. The pattern LSP may include the same material as the gate G1 of the first transistor T1 (refer to FIG. 4A). As shown in FIG. 5D, the pattern LSP may be disposed on the second insulating layer 20. The pattern LSP may include the same material as the upper electrode UE. Some signal lines, such as the second voltage line RL (refer to FIG. 2), may be disposed on the same layer as the upper electrode UE.

In FIGS. 5A to 5D, the pattern LSP may correspond to a floating electrode. The pattern LSP is electrically isolated without being electrically connected to another electrode and another signal line. However, the present inventive concept is not limited thereto. For example, the pattern LSP may be electrically connected to a gate or source of a corresponding transistor.

Figure 6A:
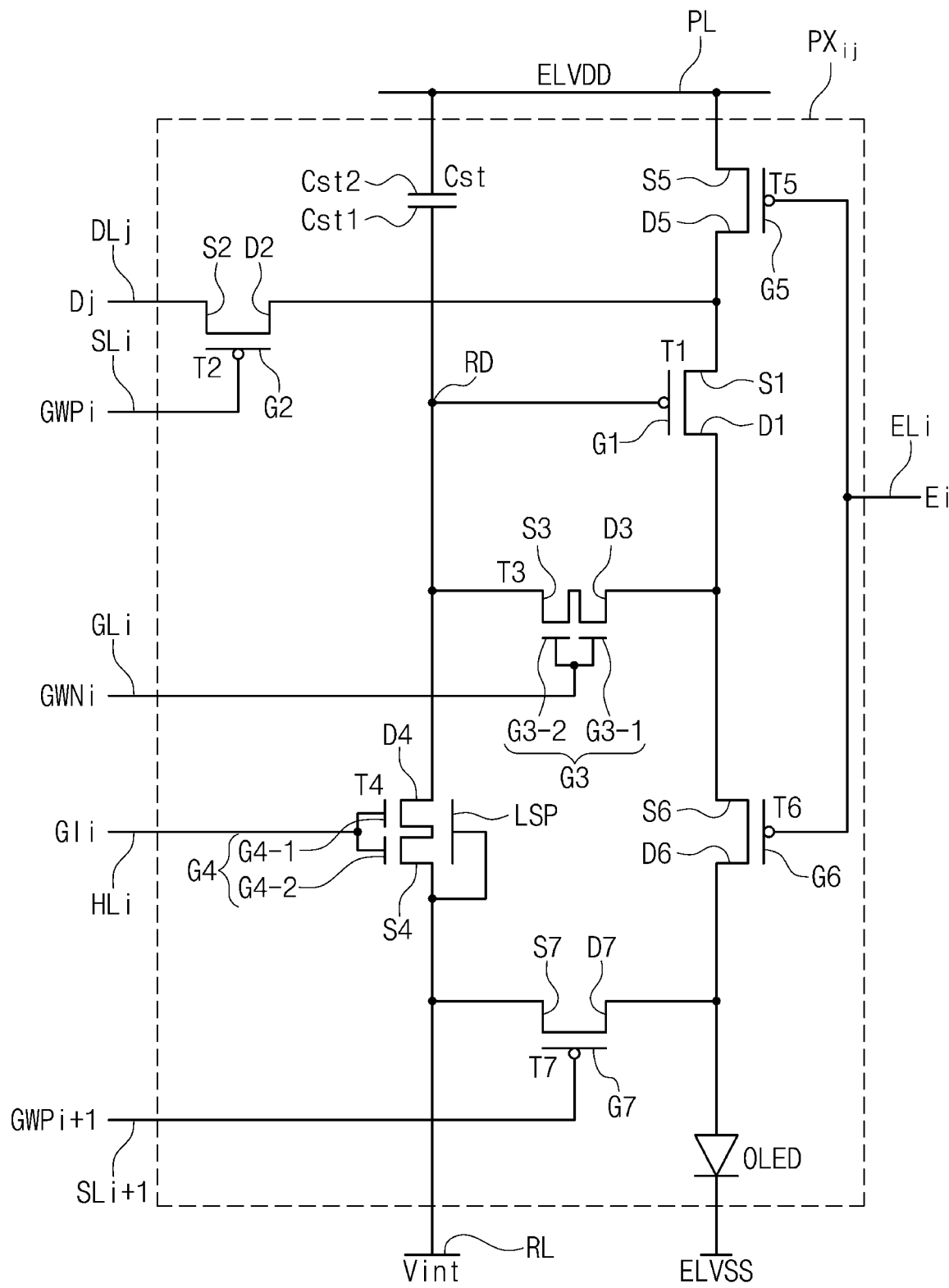
FIG. 6A is an equivalent circuit diagram showing a pixel according to an exemplary embodiment of the present inventive concept.
Figure 6B:
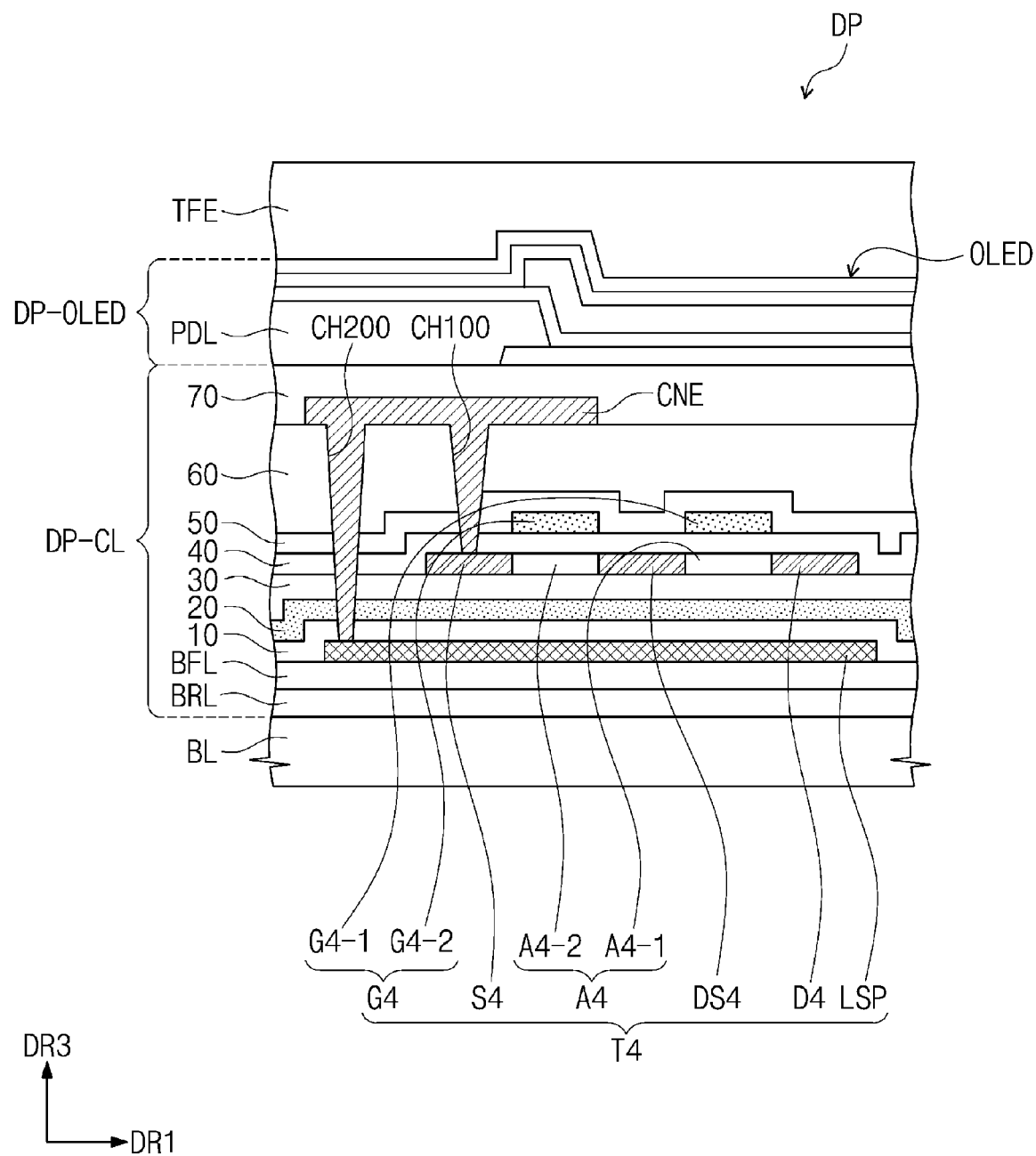
FIG. 6B is a cross-sectional view showing a fourth transistor according to an exemplary embodiment of the present inventive concept.
Figure 7A:
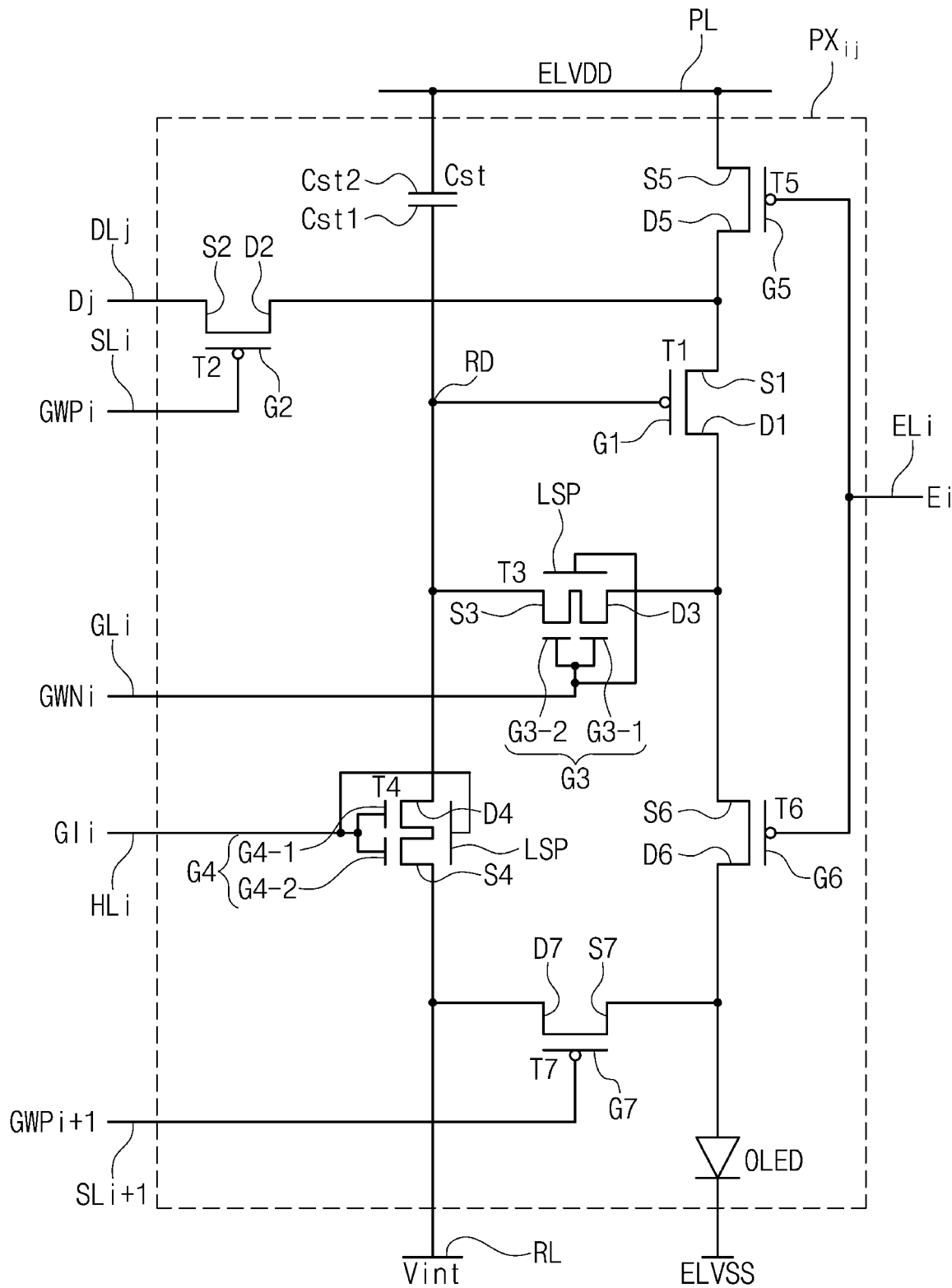
FIG. 7A is an equivalent circuit diagram showing a pixel according to an exemplary embodiment of the present inventive concept.
Figure 7B:
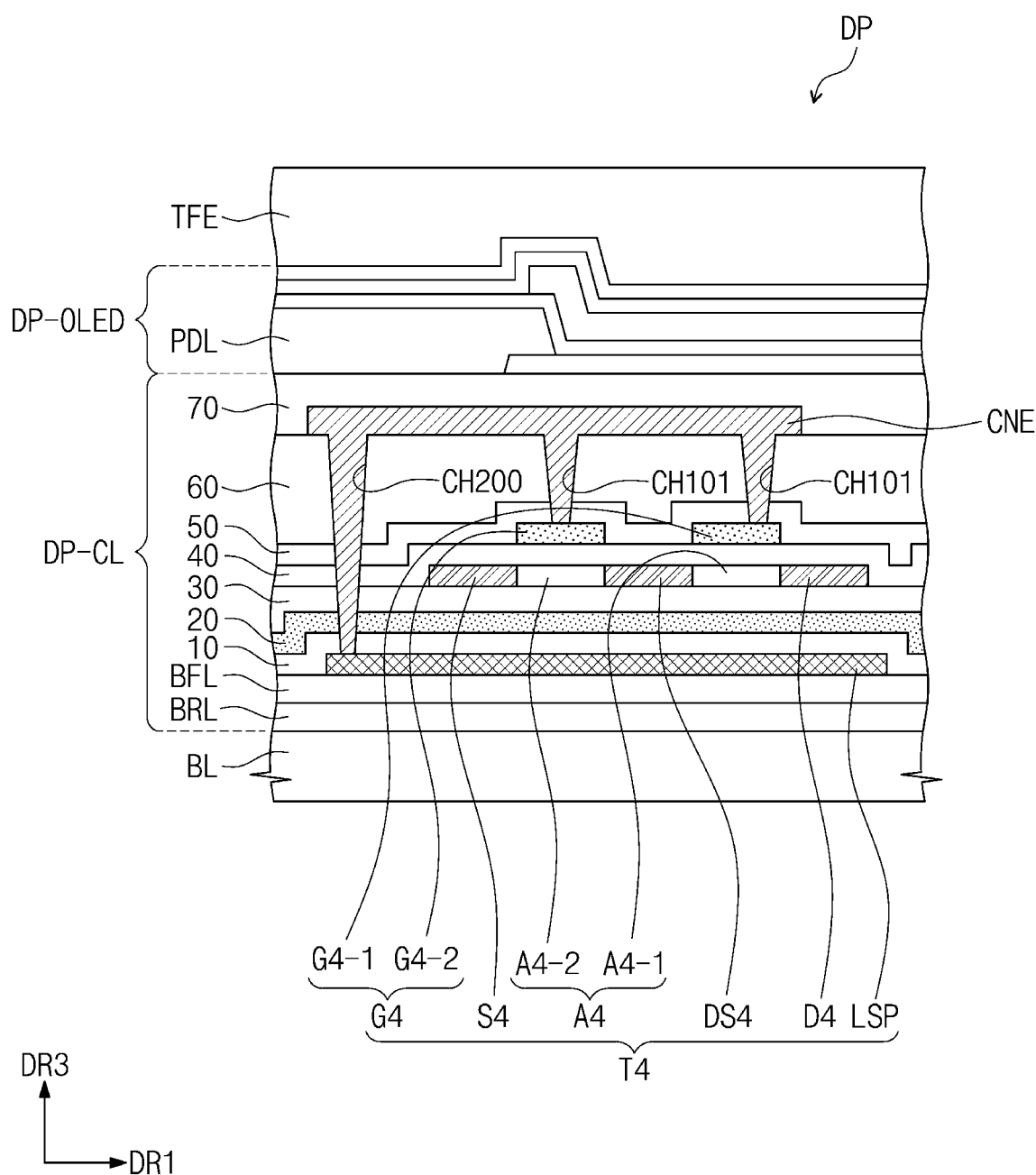
FIG. 7B is a cross-sectional view showing a fourth transistor according to an exemplary embodiment of the present inventive concept.

FIG. 6A is an equivalent circuit diagram showing a pixel PXij according to an exemplary embodiment of the present inventive concept. FIG. 6B is a cross-sectional view showing a fourth transistor T4 according to an exemplary embodiment of the present inventive concept. FIG. 7A is an equivalent circuit diagram showing a pixel PXij according to an exemplary embodiment of the present inventive concept. FIG. 7B is a cross-sectional views showing a fourth transistor T4 according to an exemplary embodiment of the present inventive concept. Hereinafter, detailed descriptions of the same elements as those described with reference to FIGS. 1 to 5B may be omitted.

Referring to FIGS. 6A and 6B, a pattern LSP may include a conductive material, and a source S4 of the fourth transistor T4 may be electrically connected to the pattern LSP. In this case, the pattern LSP may correspond to a gate disposed under the fourth transistor T4. When an initialization voltage Vint is applied to the lower gate (e.g., the pattern LSP), the fourth transistor T4 has the same voltage-current characteristic as a double-gate transistor in which a bias voltage is applied to its lower gate. The fourth transistor T4 corresponds to a single-channel transistor that is turned on in response to a voltage applied to an upper gate. The voltage-current characteristics of the fourth transistor T4 may be controlled by adjusting a level of the initialization voltage Vint.

The source S4 of the fourth transistor T4 and the pattern LSP may be connected to each other by a connection electrode CNE. The connection electrode CNE is disposed on the sixth insulating layer 60, connected to the source S4 of the fourth transistor T4 through a contact hole CH100 passing through the fourth to sixth insulating layers 40 to 60, and connected to the pattern LSP through a contact hole CH200 passing through the first to sixth insulating layers 10 to 60.

A cross-sectional structure of a third transistor T3 may correspond to a cross-sectional structure of the fourth transistor T4. A gate of the third transistor T3 may be disposed on the same layer as a gate G4 of the fourth transistor T4, and a source S3 and a drain D3 of the third transistor T3 may be disposed on the same layer as the source S4 and a drain D4 of the fourth transistor T4. A pattern of the third transistor T3 may be disposed on the same layer as the pattern LSP of the fourth transistor T4.

In the present exemplary embodiment, the pattern LSP is applied to each of the third transistor T3 and the fourth transistor T4, however, it is not limited thereto. For example, the pattern LSP may be applied to only one transistor.

In FIGS. 6A and 6B, DS4 may correspond to a drain/source of the fourth transistor T4, G4-1 and G4-2 may correspond to first and second gates of the fourth transistor T4 and A3-1 and A3-2 may correspond to first and second active areas of the fourth transistor T4.

Referring to FIGS. 7A and 7B, a pattern LSP may include a conductive material, and at least one of a gate G3 of a third transistor T3 and a gate G4 of the fourth transistor T4 may be electrically connected to a corresponding pattern LSP. In this case, the pattern LSP may correspond to a gate disposed under the third transistor T3 and the fourth transistor T4. As a first scan signal Gli is applied to the lower gate of the fourth transistor T4, and a third scan signal GWNi is applied to the lower gate of the third transistor T3, a dual-channel may be formed in the fourth transistor 14 in a turned-on state. The fourth transistor T4 may correspond to two transistors.

FIG. 7B shows a cross section of the fourth transistor T4 as a representative example. The gate G4 of the fourth transistor T4 and the pattern LSP may be connected to each other by a connection electrode CNE. The connection electrode CNE is disposed on the sixth insulating layer 60, connected to the gate G4-1, G4-2 of the fourth transistor T4 through a contact hole CH101 passing through the fifth and sixth insulating layers 50 and 60, and connected to the pattern LSP through a contact hole CH200 passing through the first to sixth insulating layers 10 to 60. In FIG. 7B, the contact hole CH101 is provided in plural. In FIG. 78, the contact hole CH101 overlaps the second active area A4-2, however, this is merely exemplary. The contact hole CH101 may not overlap the first and second active areas A4-1 and A4-2 when viewed in a plan view.

Figure 8A:
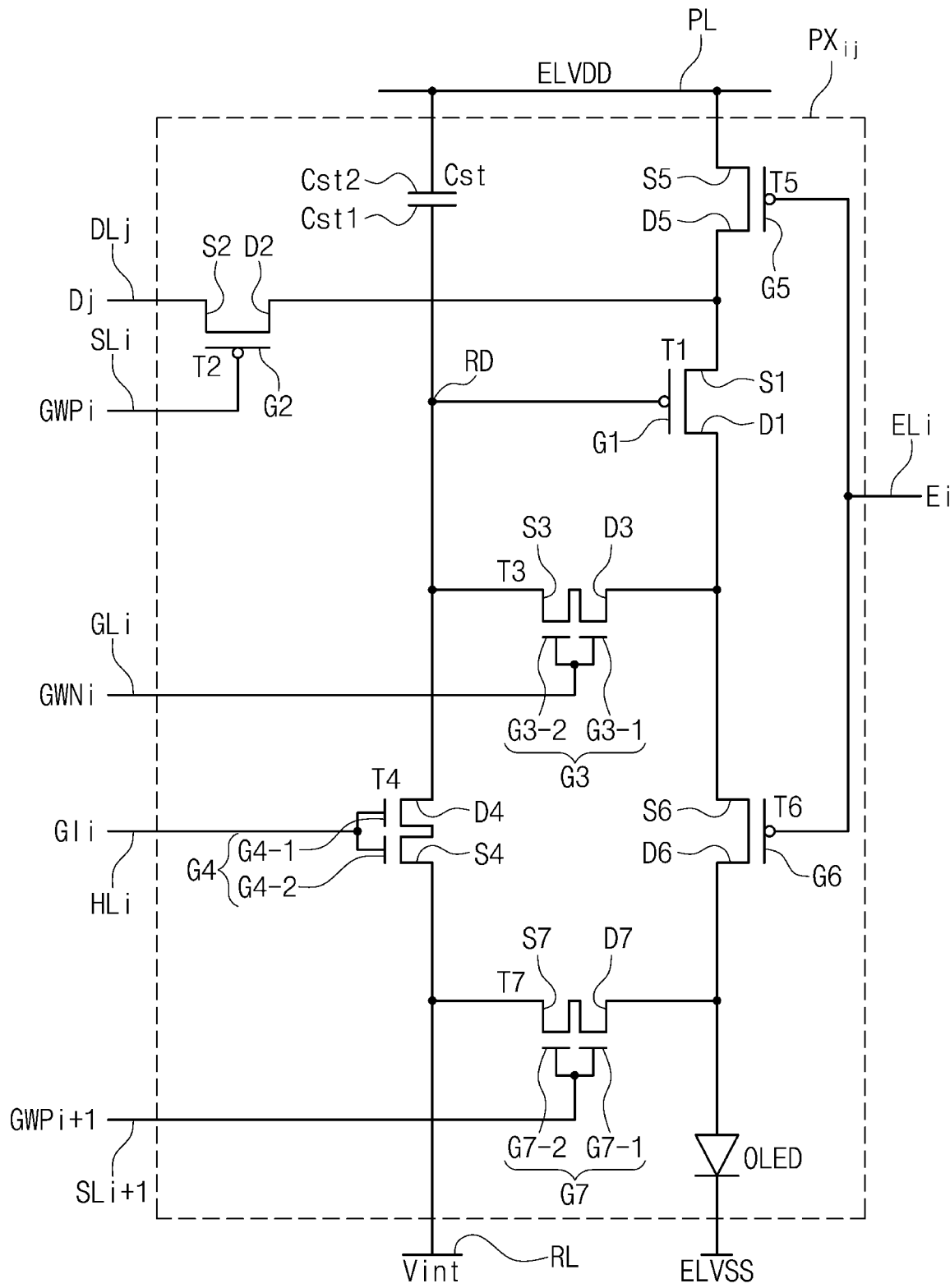
FIG. 8A is an equivalent circuit diagram showing a pixel according to an exemplary embodiment of the present inventive concept.
Figure 8B:
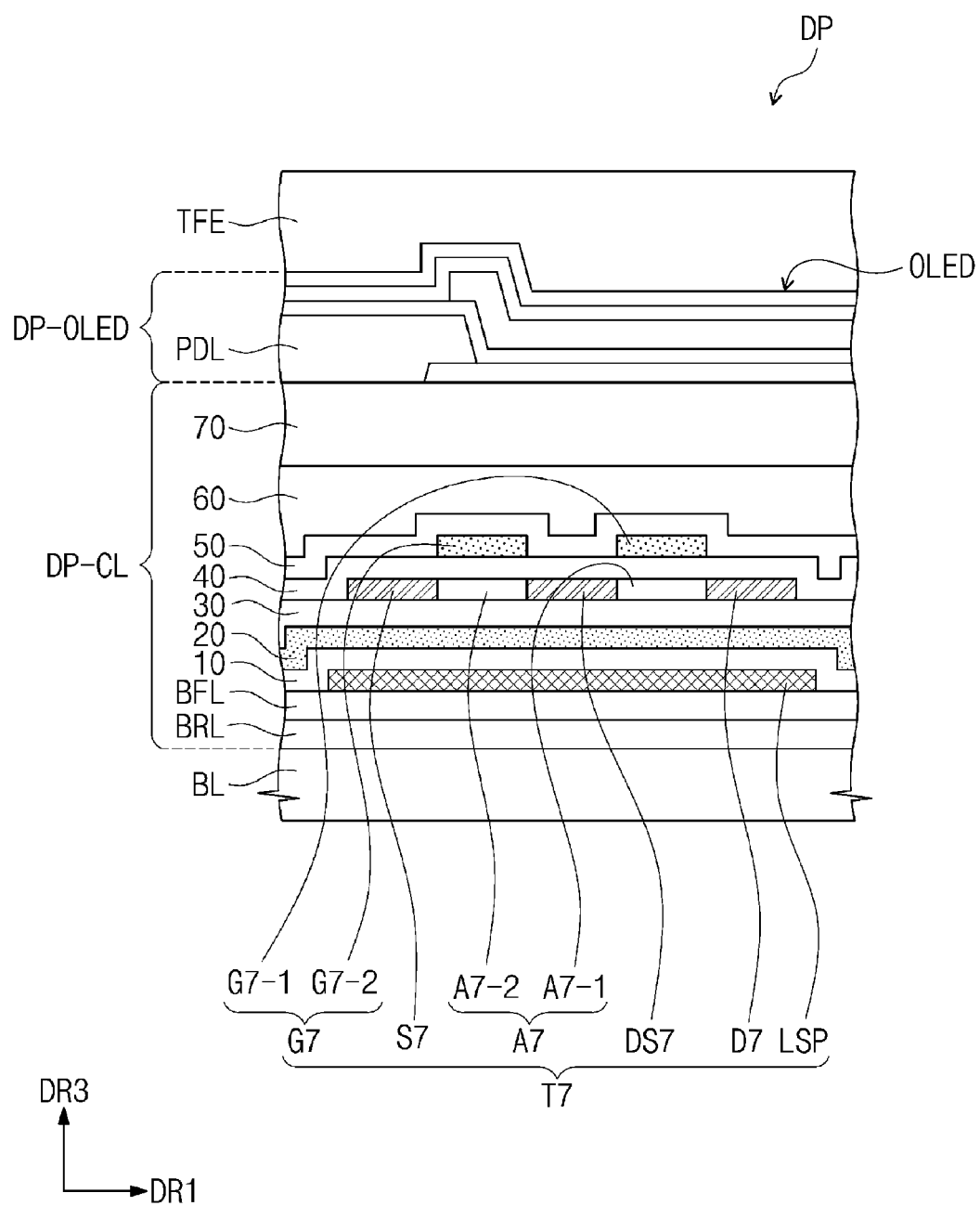
FIG. 8B is a cross-sectional view showing a seventh transistor according to an exemplary embodiment of the present inventive concept.

FIG. 8A is an equivalent circuit diagram showing a pixel PXij according to an exemplary embodiment of the present inventive concept. FIG. 8B is a cross-sectional view showing a seventh transistor T7 according to an exemplary embodiment of the present inventive concept. Hereinafter, detailed descriptions of the same elements as those described with reference to FIGS. 1 to 7B may be omitted.

As shown in FIGS. 8A and 8B, the seventh transistor T7 may be an N-type transistor. An active area of the seventh transistor T7 may include a metal oxide semiconductor. The seventh transistor T7 may include two gates G7-1 and G7-2. In addition, the seventh transistor T7 may include two active areas A7-1 and A7-2 respectively corresponding to the two gates G7-1 and G7-2. The seventh transistor T7 may include a pattern LSP.

FIG. 8B shows the seventh transistor T7 having the same structure as that of the third transistor T3 shown in FIG. 5B, however, the structure of the seventh transistor T7 is not limited thereto. The seventh transistor T7 may be modified as the third transistor T3 shown in FIGS. 5C and 5D or the fourth transistor T4 shown in FIGS. 6A to 7B.

In the embodiments of the inventive concept described with reference to FIGS. SA to 8B, the third transistor T3, the fourth transistor T4, and the seventh transistor T7 include the active area of the metal oxide semiconductor, however, they are not limited thereto. Some transistors of the first to seventh transistors T1 to T7 may include the active area of the metal oxide semiconductor, while other transistors of the first to seventh transistors T1 to T7 may include the active area of the polysilicon. Among the first to seventh transistors T1 to T7, the transistor having the active area of the metal oxide semiconductor may include the pattern LSP described with reference to FIGS. 5A to 7B.

Figure 9:
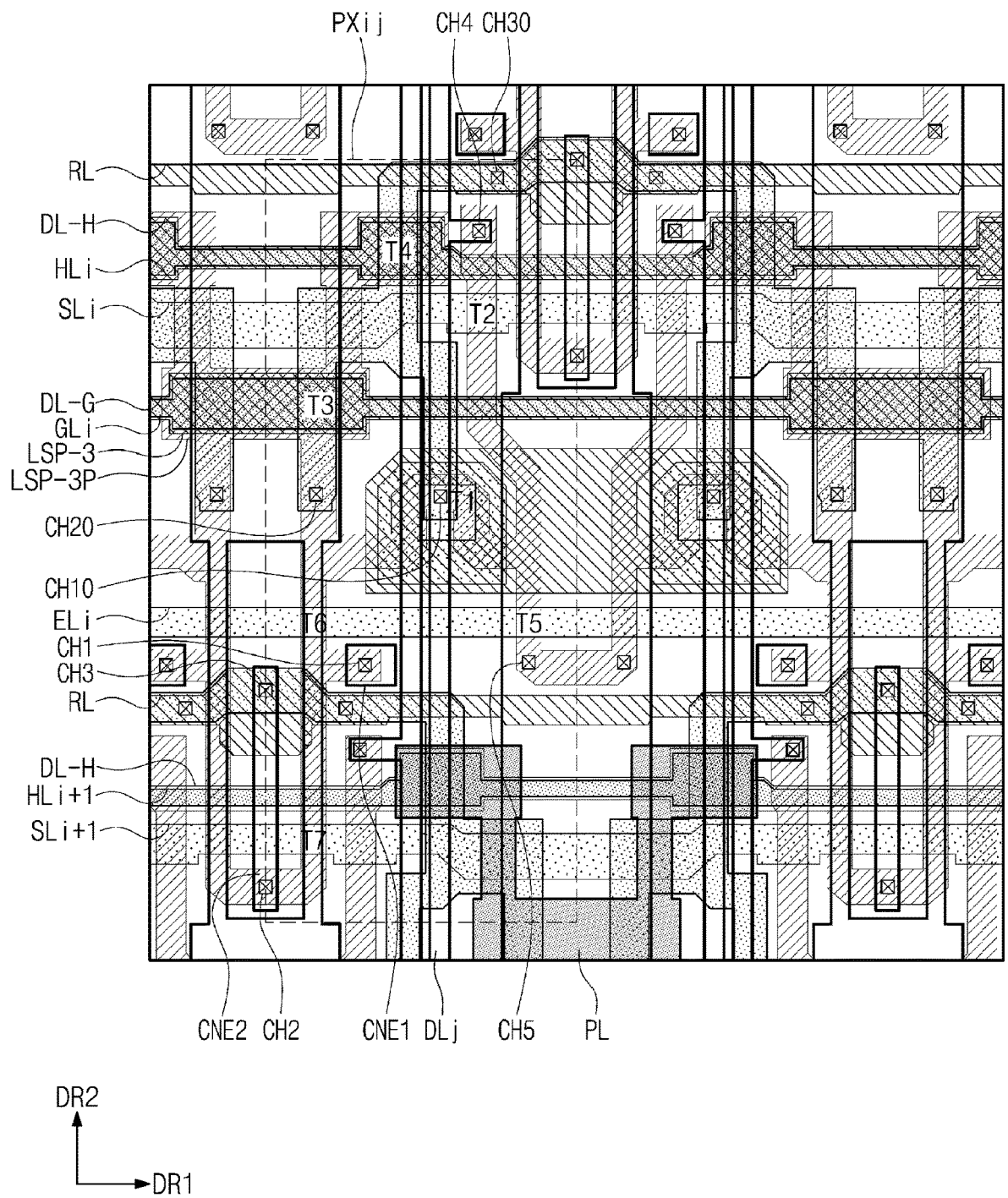
FIG. 9 is a plan view showing a pixel according to an exemplary embodiment of the present inventive concept.

FIG. 9 is a plan view showing a pixel PXij according to an exemplary embodiment of the present inventive concept. FIGS. 10A to 10K are plan views showing a stacking order of patterns of the pixel PXij according to an exemplary embodiment of the present inventive concept. Hereinafter, detailed descriptions of the same elements as those described with reference to FIGS. 1 to 8B may be omitted.

FIG. 9 shows the plan view of the pixel PXij having the equivalent circuit of FIG. 2. Referring to FIG. 9, first to seventh transistors T1-T7 of the pixel PXij are shown. In addition, the i-th scan line SLi of the first group, the (i+1)th scan line SLi+1 of the first group, the i-th scan line GLi of the second group, the i-th scan line HLi of the third group, and the i-th light emitting line ELi are shown. Different from the equivalent circuit of FIG. 2, each of third and fourth transistors T3 and T4 includes one gate, e.g., G3 and G4.

Figure 10A:
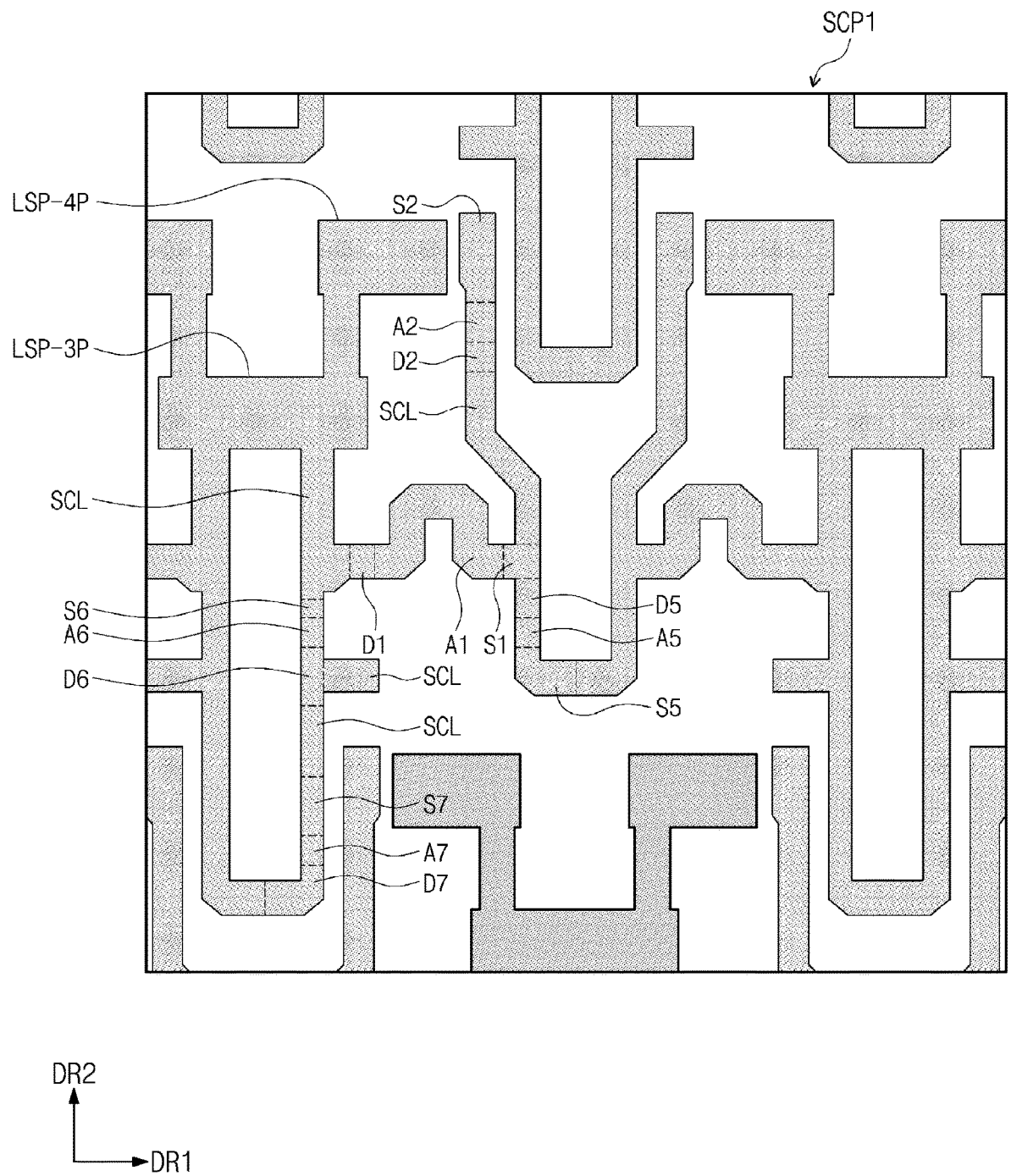
FIGS. 10A, 10B, 10C, 10D, 10E, 10F, 10G, 10H, 10I, 10J and 10K are plan views showing a stacking order of patterns of a pixel according to an exemplary embodiment of the present inventive concept.

Referring to FIG. 10A, the first semiconductor pattern SCP1 is disposed on the base layer BL (refer to FIG. 4A). The first semiconductor pattern SCP1 may include a plurality of areas having different doping concentrations. The first semiconductor pattern SCP1 may include the sources S1, S2, S5, S6, and S7, the active areas A1, A2, A5, A6, and A7, and the drains D1, D2, D5, D6, and D7 of the first, second, fifth, sixth, and seventh transistors T1, T2, T5, T6, and T7 (refer to FIG. 9). The first semiconductor pattern SCP1 may include the connection signal lines SCL.

Portions of the first semiconductor pattern SCP1 may be patterns LSP-3P and LSP-4P of the transistors. A first portion of the first semiconductor pattern SCP1 may be the pattern LSP-3P of the third transistor T3, and a second portion of the first semiconductor pattern SCP1 may be the pattern LSP-4P of the fourth transistor T4. The first and second portions corresponding to the patterns LSP-3P and LSP-4P may overlap patterns LSP-3 and LSP-4 shown in FIG. 10D. The patterns LSP-3P and LSP-4P of FIG. 10A and the patterns LSP-3 and LSP-4 of FIG. 10D correspond to a double pattern.

The pattern LSP-3P of the third transistor T3 and the pattern LSP-4P of the fourth transistor T4 have an area greater than an area of the active areas A2, A5, A6, and A7 of the transistors T2, T5, T6, and T7 except for the first transistor T1. The reason why the patterns LSP-3P and LSP-4P in FIG. 10A have such an area is so that they cover the patterns LSP-3 and LSP-4 shown in FIG. 10D and the active areas A3 and A4 of the third and fourth transistors T3 and T4 shown in FIG. 10G. This is because the area of the active areas A3 and A4 of the third and fourth transistors T3 and T4 is greater than the area of the active areas A2, A5, A6, and A7 of the second, fifth, sixth, and seventh transistors T2, T5, T6, and T7.

Referring to FIG. 10A again, one pattern LSP-4P or LSP-3P may extend from another pattern LSP-3P or LSP-4P. The pattern LSP-3P extends from the active area A1 of the first transistor T1. In the present exemplary embodiment, the first semiconductor pattern SCP1 corresponding to the pixel PXij has an integral shape, however, it is not limited thereto. The pattern LSP-4P and the pattern LSP-3P may be separated from each other, and the pattern LSP-3P may be separated from the active area A1 of the first transistor T1.

Figure 10B:
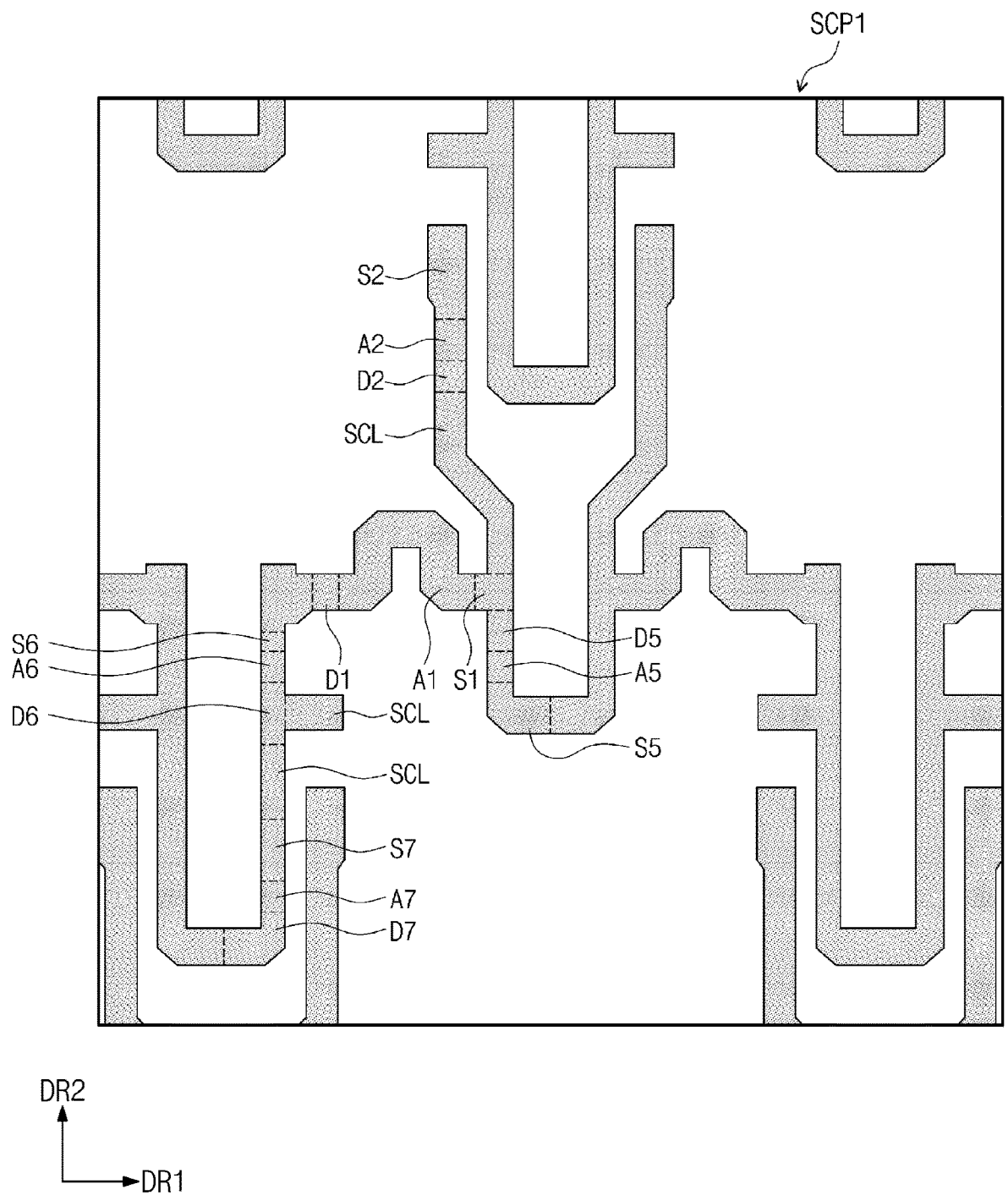

FIG. 10B shows a plan view of a first semiconductor pattern SCP1 according to another exemplary embodiment of the present inventive concept. As shown in FIG. 10B, portions corresponding to patterns LSP-3P and LSP-4P of the first semiconductor pattern SCP1 in FIG. 10A may be omitted.

Figure 10C:
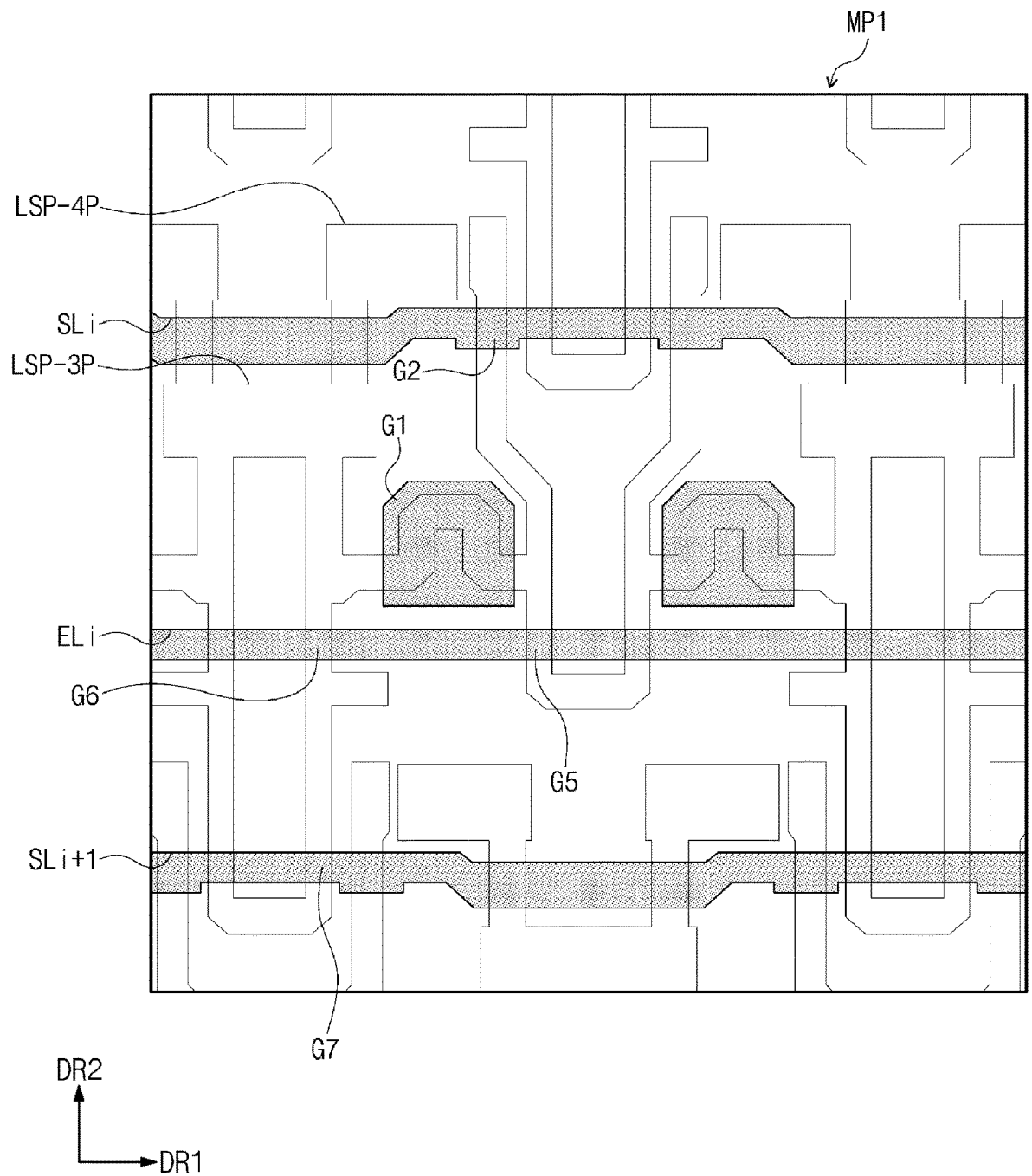

FIG. 10C shows the patterns based on FIG. 10A. Referring to FIG. 10C, a first metal pattern MP1 is disposed on the first insulating layer 10 (refer to FIG. 4A). The first metal pattern MP1 may include the gate G1 of the first transistor T1, the i-th scan line SLi of the first group, the (i+1)th scan line SLi+1 of the first group, and the i-th light emitting line ELi. A portion of the i-th scan line SLi of the first group may be the gate G2 of the second transistor T2, and a portion of the (i+1)th scan line SLi+1 of the first group may be the gate G7 of the seventh transistor T7. A portion of the i-th light emitting line ELi may be the gate G5 of the fifth transistor T5, and another portion of the i-th light emitting line ELi may be the gate G6 of the sixth transistor T6.

Figure 10D:
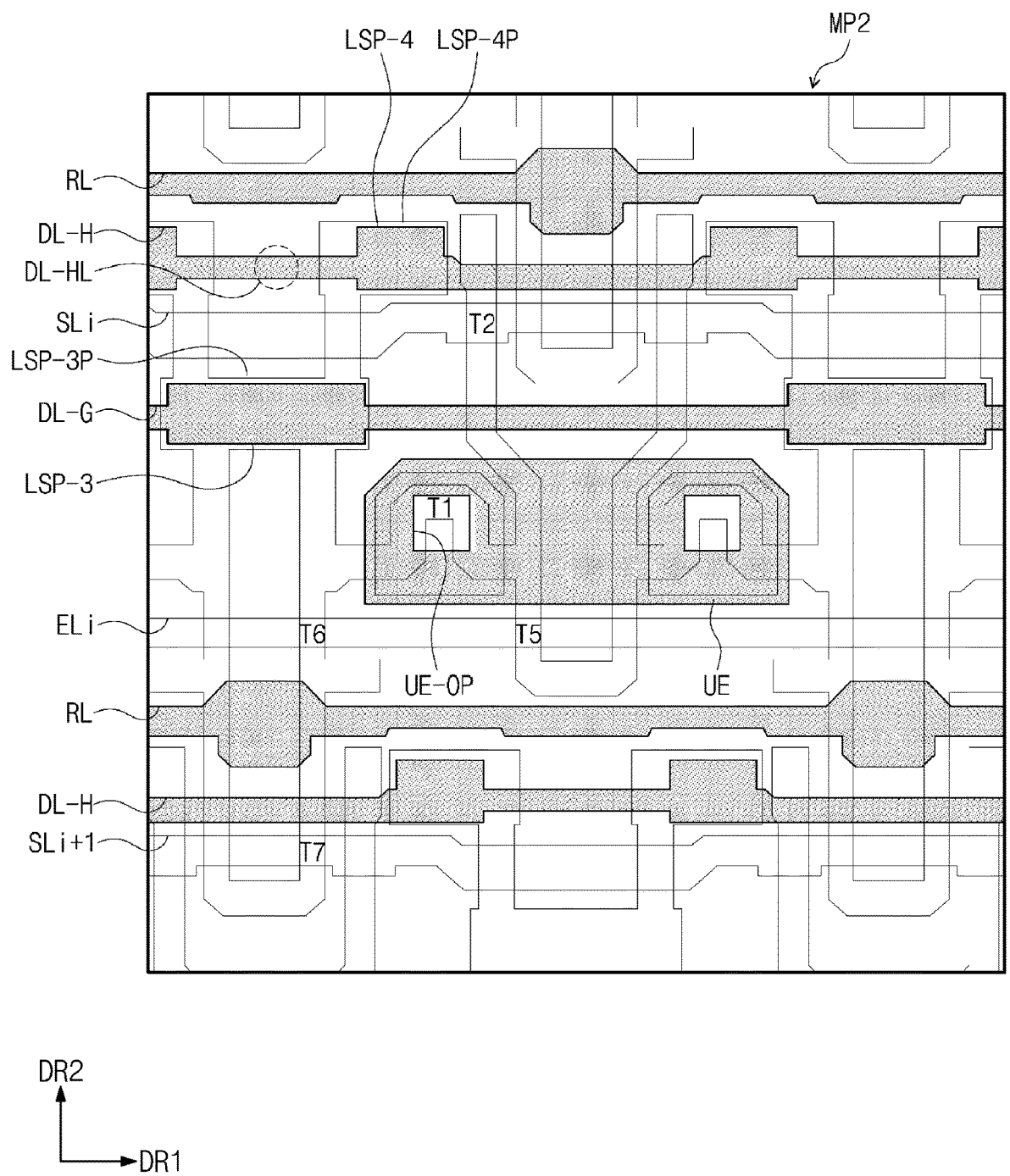

Referring to FIG. 10D, a second metal pattern MP2 is disposed on the second insulating layer 20 (refer to FIG. 4A). The second metal pattern MP2 may include the upper electrode UE, the second voltage line RL, and dummy lines DL-H and DL-G. The upper electrode UE, the second voltage line RL, and the dummy lines DL-H and DL-G may include the same metal and the same layer structure as each other. The upper electrode UE may be provided with an opening UE-OP passing therethrough.

First dummy lines DL-H overlap the i-th scan line HLi of the third group described later. Second dummy lines DL-G overlap the i-th scan line GLi of the second group described later. Portions of the first dummy lines DL-H may be a pattern LSP-4 of the fourth transistor T4, and portions of the second dummy lines DL-G may be a pattern LSP-3 of the third transistor T3.

The patterns LSP-3 and LSP-4 shown in FIG. 10D overlap the patterns LSP-3P and LSP-4P to form a double pattern as described with reference to FIG. 10A. In the case of forming the double pattern, an area of the patterns LSP-3 and LSP-4 of the second metal pattern MP2 may be adjusted. The area of the patterns LSP-3 and LSP-4 of the second metal pattern MP2 may be smaller than the area of the patterns LSP-3P and LSP-4P of the first semiconductor pattern SCP1. The area of the patterns LSP-3 and LSP-4 of the second metal pattern MP2 may at least overlap the patterns LSP-3P and LSP-4P of the first semiconductor pattern SCP1. The patterns LSP-3 and LSP-4 of the second metal pattern MP2 may have a width corresponding to a width of a line portion DL-HL to reduce a parasitic capacitance between the patterns LSP-3 and LSP-4 of the second metal pattern MP2 and the patterns LSP-3P and LSP-4P of the first semiconductor pattern SCP1. In an exemplary embodiment of the present inventive concept, the dummy lines DL-H and DL-G may be omitted, and only the patterns LSP-3 and LSP-4 of the second metal pattern MP2 may be provided. In an exemplary embodiment of the present inventive concept, the patterns LSP-3P and LSP-4P shown in FIG. 10A may be omitted, and the patterns LSP-3 and LSP-4 shown in FIG. 10D or the dummy lines DL-H and DL-G shown in FIG. 10D may be provided.

Figure 10E:
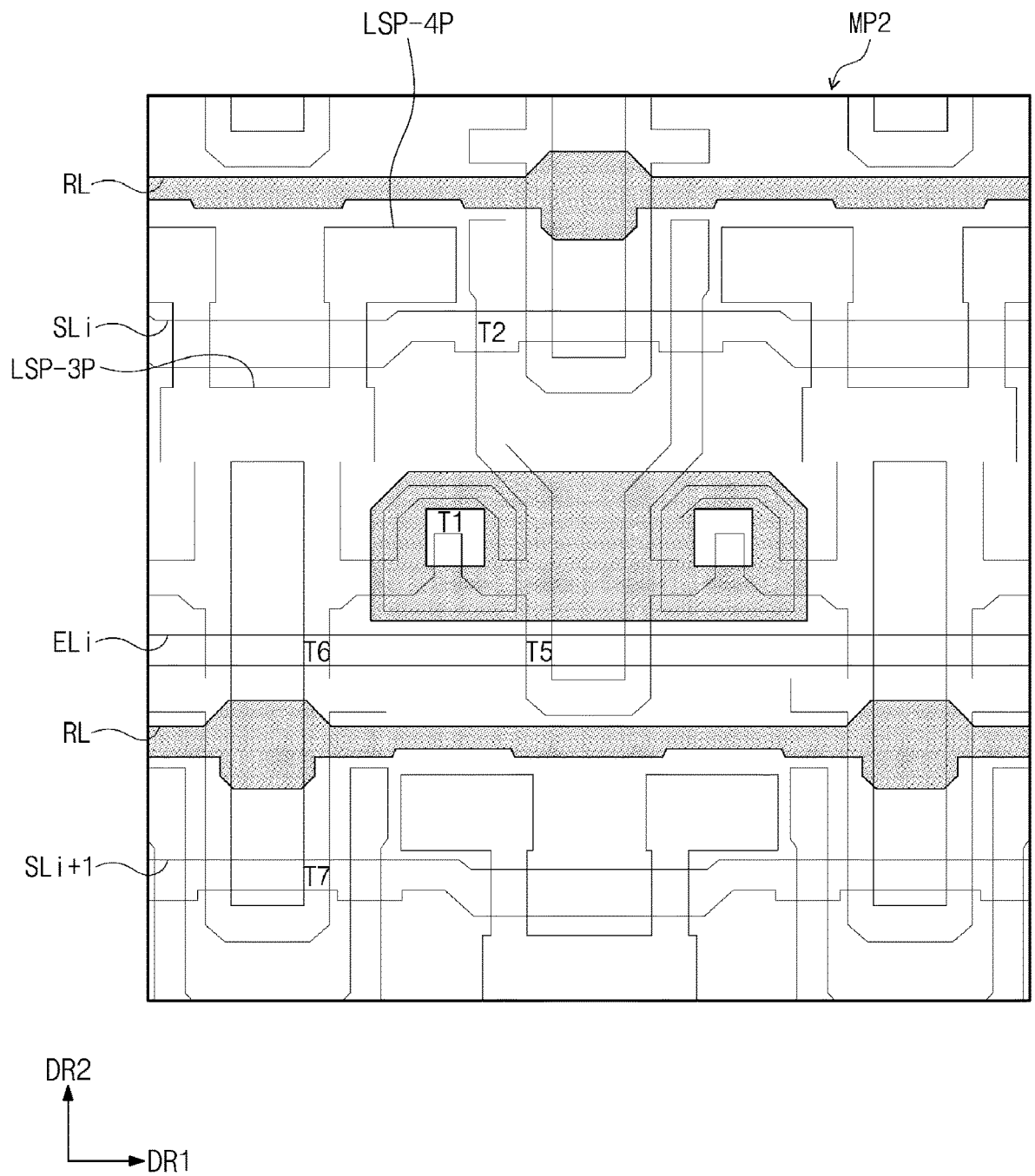

In an exemplary embodiment of the present inventive concept, the dummy lines DL-H and DL-G may be omitted. This structure is shown in FIG. 10E. In this case, portions corresponding to the patterns LSP-3P and LSP-4P of the first semiconductor pattern SCP1 may be the light blocking pattern of the third transistor T3 and the fourth transistor T4.

Figure 10F:
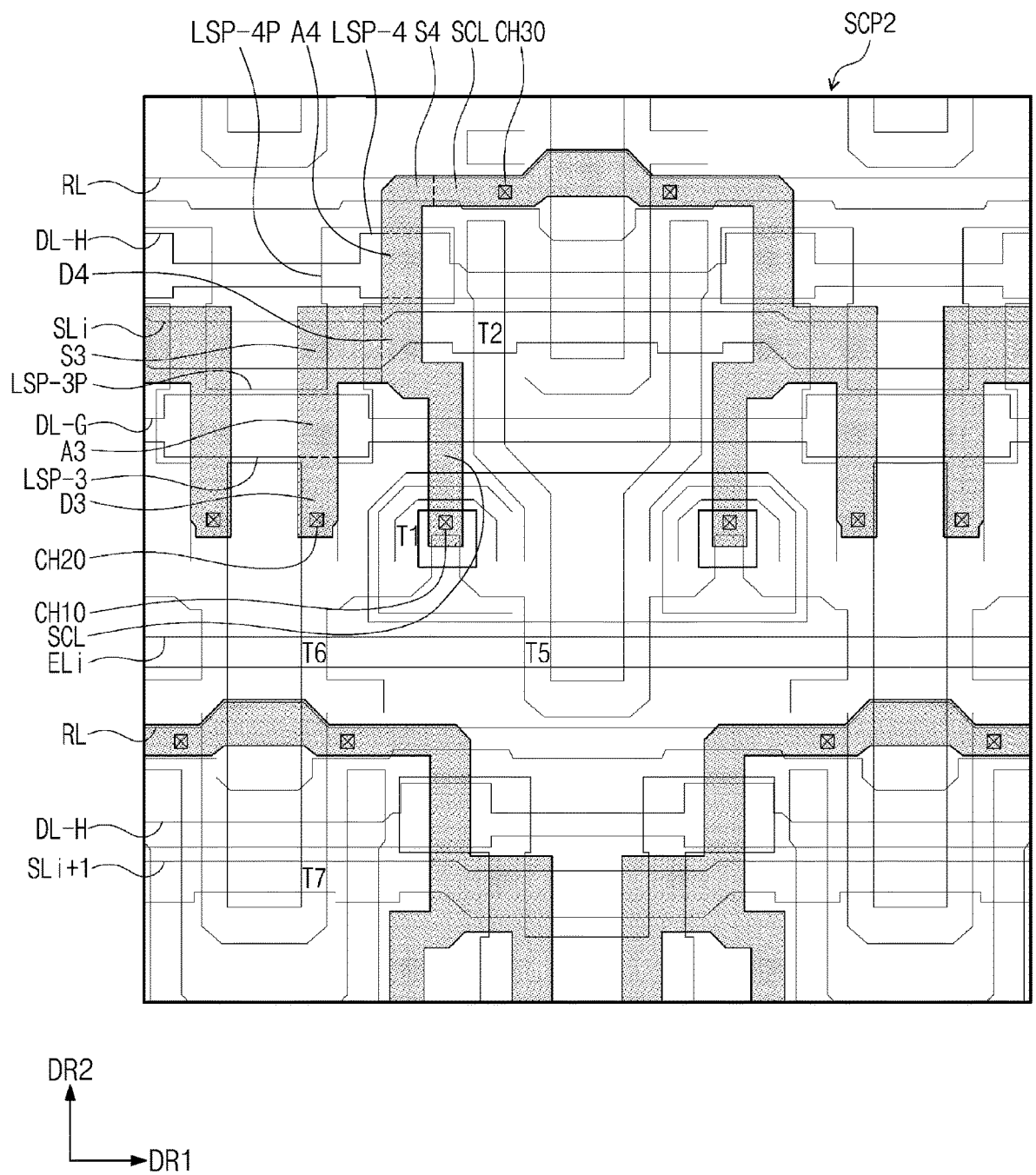

Referring to FIG. 10F, the second semiconductor pattern SCP2 is disposed on the third insulating layer 30 (refer to FIG. 4A). The second semiconductor pattern SCP2 may include the areas distinguished from each other depending on whether the metal oxide is reduced. The second semiconductor pattern SCP2 may include the sources S3 and S4, the active areas A3 and A4, and the drains D3 and D4 of the third and fourth transistors T3 and T4 (refer to FIG. 9). The active area A4 of the fourth transistor T4 extends from the active area A3 of the third transistor T3. The second semiconductor pattern SCP2 includes the connection signal lines SCL.

One connection signal line SCL extends from the source S3 of the third transistor T3 and/or the drain D4 of the fourth transistor T4. The connection signal line SCL is connected to the gate G1 of the first transistor T1 through a contact hole CH10. Referring to FIGS. 4A, 4B, 5A, and 5B, the contact hole CH10 penetrates through the second and third insulating layers 20 and 30.

Referring to FIGS. 10A and 10F, the drain D3 of the third transistor T3 is connected to the connection signal line SCL of the first semiconductor pattern SCP1 through a contact hole CH20. Referring to FIGS. 10A and 10F, the drain D3 of the third transistor T3 is connected to the source S6 of the sixth transistor T6. Referring to FIGS. 10D and 10F, the source S4 of the fourth transistor T4 is connected to the second voltage line RL through a contact hole CH30. The connection signal line SCL extending from the source S4 of the fourth transistor T4 may overlap the contact hole CH30.

Figure 10G:
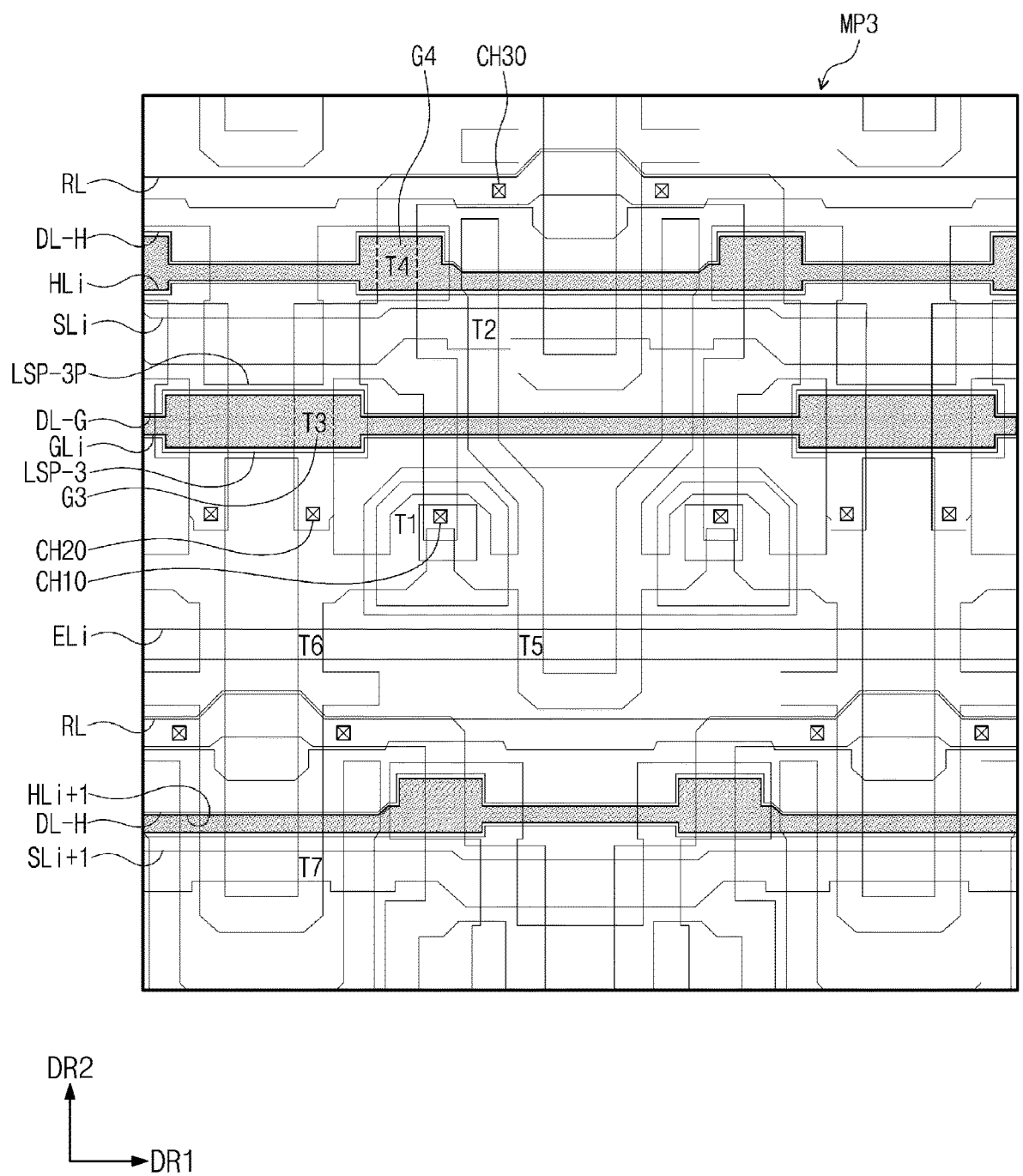

Referring to FIG. 10G, a third metal pattern MP3 is disposed on the fourth insulating layer 40 (refer to FIG. 4A). The third metal pattern MP3 may include the i-th scan line GLi of the second group and the i-th scan line HLi of the third group. A portion of the i-th scan line GLi of the second group may be the gate G3 of the third transistor T3, and a portion of the i-th scan line HLi of the third group may be the gate G4 of the fourth transistor T4.

Figure 10H:
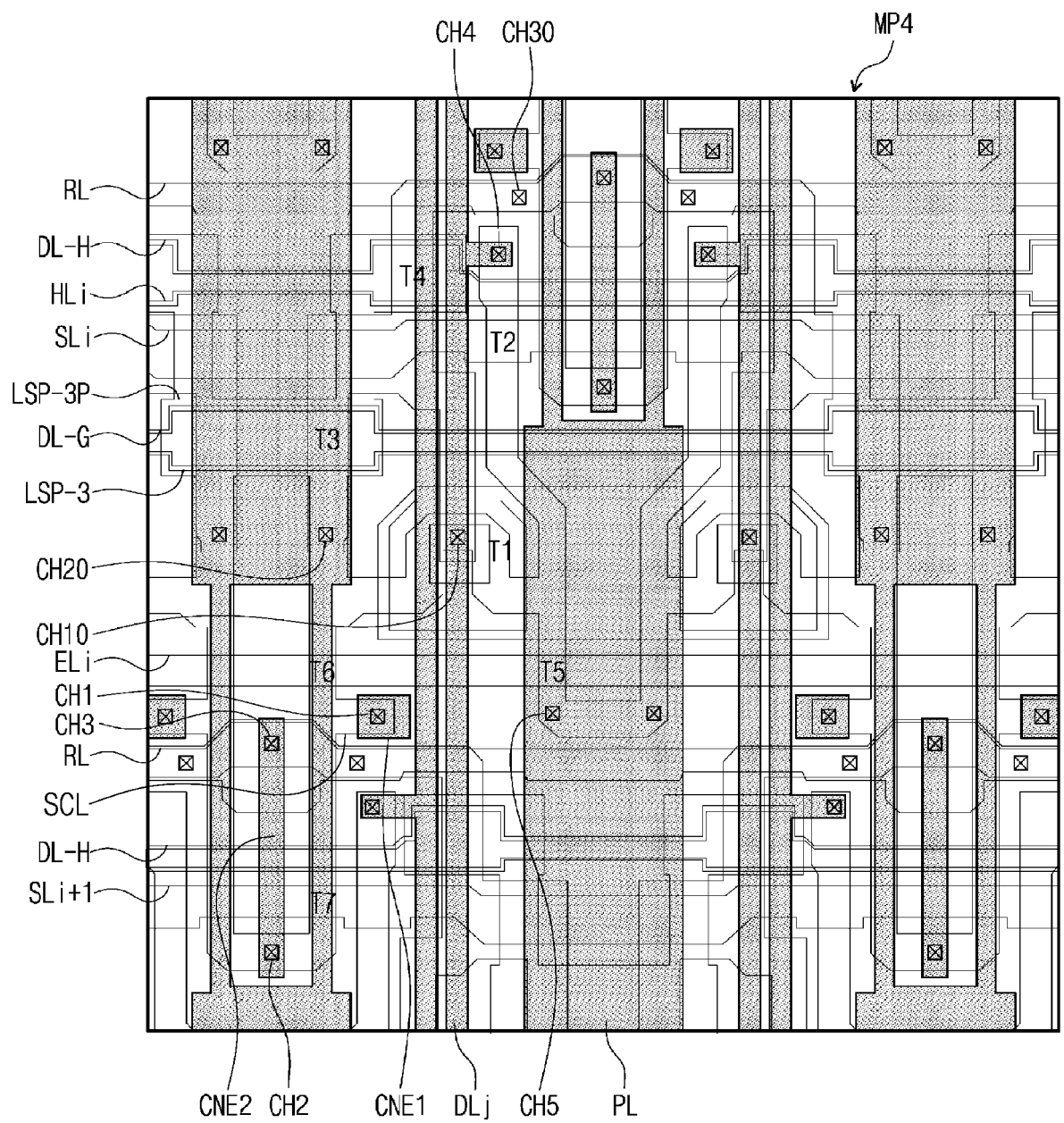

Referring to FIG. 10H, a fourth metal pattern MP4 is disposed on the sixth insulating layer 60 (refer to FIG. 4A). The fourth metal pattern MP4 may include a first connection electrode CNE1, a second connection electrode CNE2, the data line DLj, and the first voltage line PL. FIG. 10H shows a portion of the data line DLj and the first voltage line PL. Referring to FIGS. 10A and 10H, the first connection electrode CNE1 is connected to the connection signal line SCL through a contact hole CH1. The first connection electrode CNE1 may be the first connection electrode CNE1 shown in FIG. 4A. The second connection electrode CNE2 connects the drain D7 of the seventh transistor T7 to the second voltage line RL through contact holes CH2 and CH3. The data line DLj is connected to the source S2 of the second transistor T2 through a contact hole CH4. The first voltage line PL is connected to the source S5 of the fifth transistor T5 through a contact hole CH5.

In addition, FIG. 10H shows the structure in which one pixel overlaps one data line DLj, however, the inventive concept is not be limited thereto. For example, one pixel may overlap two data lines. Among the two data lines, one data line may be connected to pixels arranged in one pixel row, and the other data line may be connected to pixels arranged in a pixel row adjacent to the one pixel row. The one pixel row may be an odd-numbered pixel row or an even-numbered pixel row.

Figure 10I:
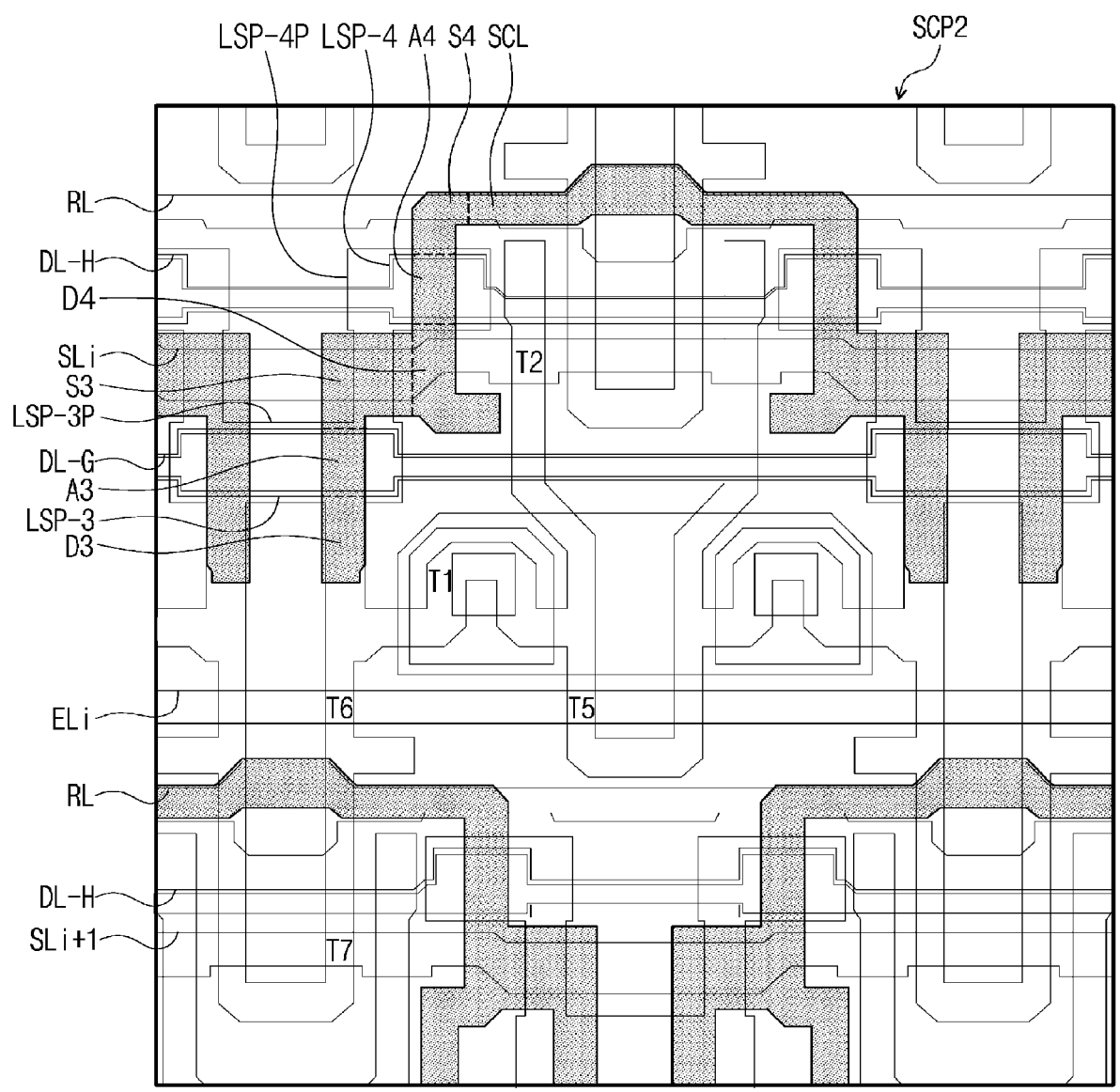
Figure 10J:
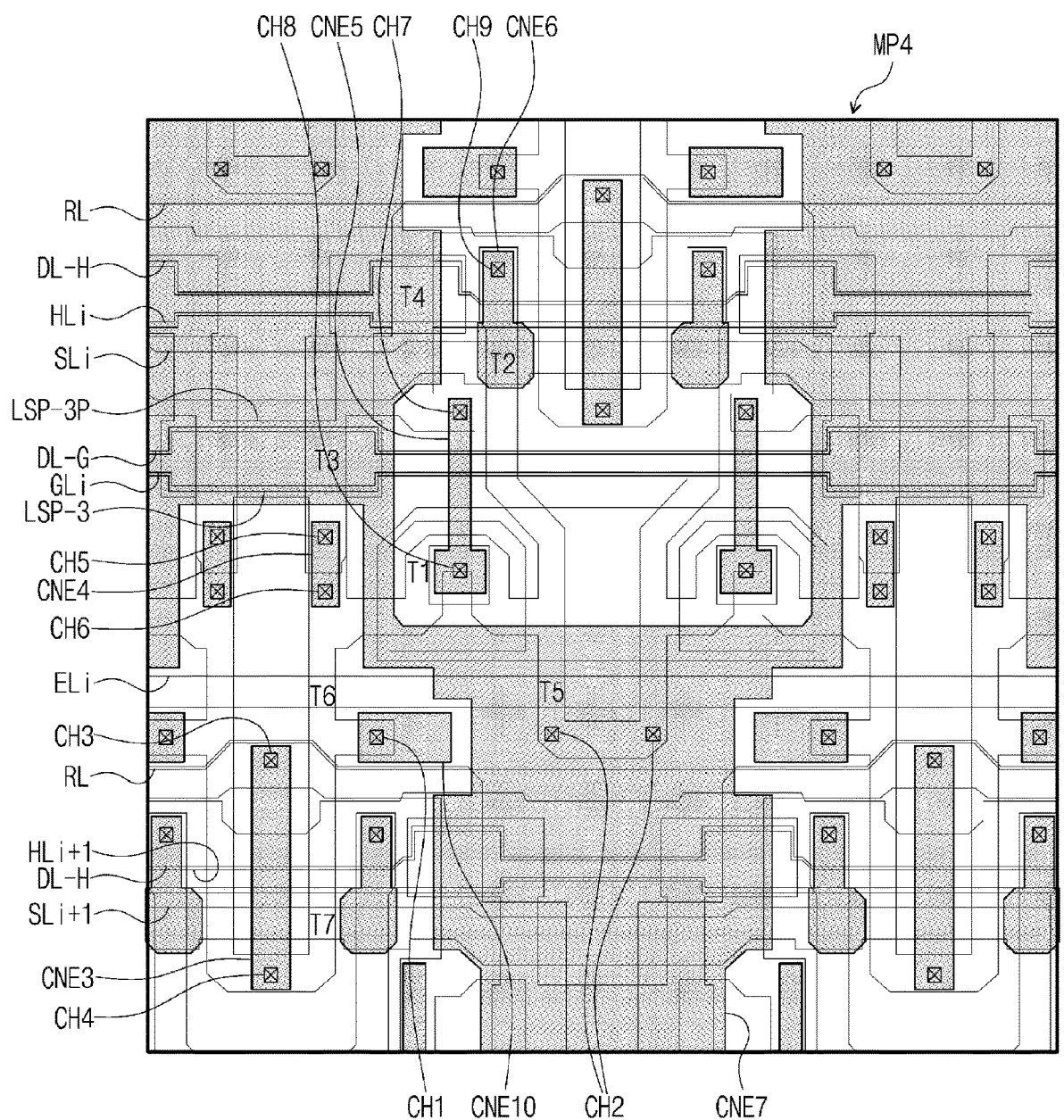
Figure 10K:
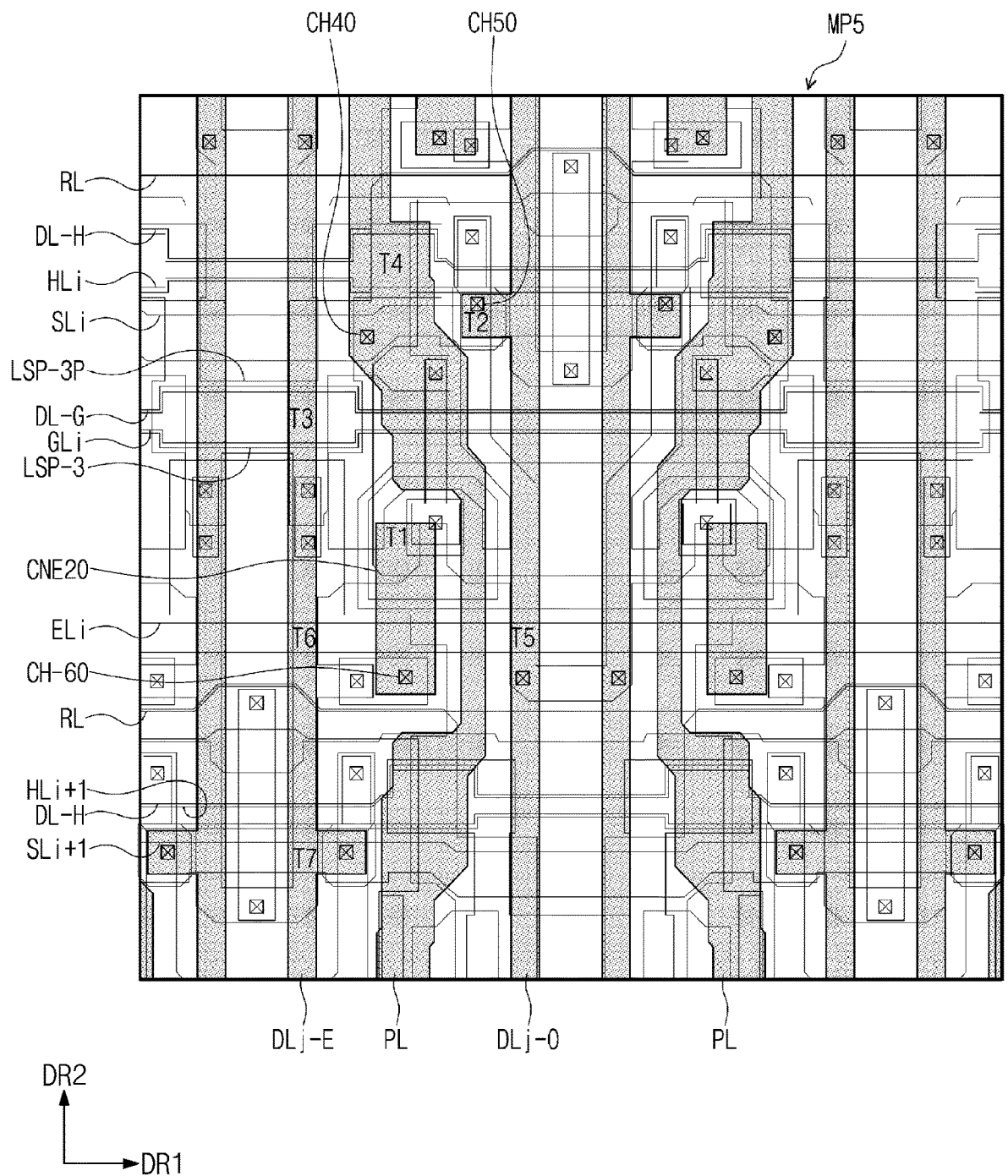

FIGS. 10I to 10K show a plan view of a pixel PXij according to another exemplary embodiment of the inventive concept, which is different from the plan view of the pixel PXij shown in FIGS. 10A to 10H. FIG. 10I corresponds to FIG. 10F. Referring to FIG. 10I, the contact holes CH10, CH20, and CH30 are not formed unlike FIG. 10F. In other words, the second semiconductor pattern SCP2 may not be directly connected to the first semiconductor pattern SCP1, the first metal pattern MP1, or the second metal pattern MP2 shown in FIGS. 10A to 10E. In addition, referring to FIG. 10I, the connection signal line SCL overlapping with the first transistor T1 is omitted unlike FIG. 10F.

According to the present exemplary embodiment, different from the pixel PXij shown in FIGS. 10A to 10H, the fourth metal pattern MP4 and the fifth metal pattern MP5 are disposed on the third metal pattern MP3. FIG. 10J shows the fourth metal pattern MP4, and FIG. 10K shows the fifth metal pattern MP5.

Referring to FIG. 10J, the third metal pattern MP3 described with reference to FIG. 10G is additionally disposed. The third metal pattern MP3 may include the i-th scan line GLi of the second group, the i-th scan line HLi of the third group, and a (i+1)th scan line HLi+1 of the third group.

Referring to FIG. 10J, third, fourth, fifth, sixth, and seventh connection electrodes CNE3, CNE4, CNE5, CNE6, and CNE7 formed from the fourth metal pattern MP4 and second, third, fourth, fifth, sixth, seventh, eighth, and ninth contact holes CH2, CH3, CH4, CH5, CH6, CH7, CH8, and CH9 through which the connection electrodes CNE3 to CNE7 are connected to the first semiconductor pattern SCP1, the first metal pattern MP1, or the second metal pattern MP2 are shown. The third connection electrode CNE3 connects the second voltage line RL to the seventh transistor T7 through the third contact hole CH3 and the fourth contact hole CH4. The fourth connection electrode CNE4 connects the third transistor T3 to the sixth transistor T6 through the fifth contact hole CH5 and the sixth contact hole CH6. The fifth connection electrode CNE5 connects the third transistor T3 to the first transistor T1 and the fourth transistor T4 to the first transistor T1 through the seventh contact hole CH7 and the eighth contact hole CH8. The sixth connection electrode CNE6 is connected to the second transistor T2 through the ninth contact hole CH9. The seventh connection electrode CNE7 is connected to the fifth transistor T5 through the second contact hole CH2. The first connection electrode CNE10 is electrically connected to the sixth transistor T6 through the first contact hole CH1.

Referring to FIG. 10K, a connection electrode CNE20, data lines DLj-E and DLj-O, and the first voltage line PL, which are formed from the fifth metal pattern MP5, are shown. In addition, contact holes CH-60, CH40, and CH50 through which the connection electrode CNE20, the data lines DLj-E and DLj-O, and the first voltage line PL are connected to the fourth metal pattern MP4 are shown. The connection electrode CNE20 is connected to the connection electrode CNE10 through the contact hole CH-60. The first voltage line PL is connected to the seventh connection electrode CNE7 through the contact hole CH40, and the first voltage line PL is electrically connected to the fifth transistor T5. The data line DLj-O is connected to the sixth connection electrode CNE6 through the contact hole CH50, and the data line DLj-O is electrically connected to the second transistor T2. Two data lines DLj-E and DLj-O overlap with one pixel, however, one data line DLj-O is connected to the one pixel, and the other data line DLj-E is connected to a pixel adjacent to the one pixel. When the one data line DLj-O is connected to the odd-numbered pixel row, the other data line DLj-E is connected to the even-numbered pixel row.

Figure 11:
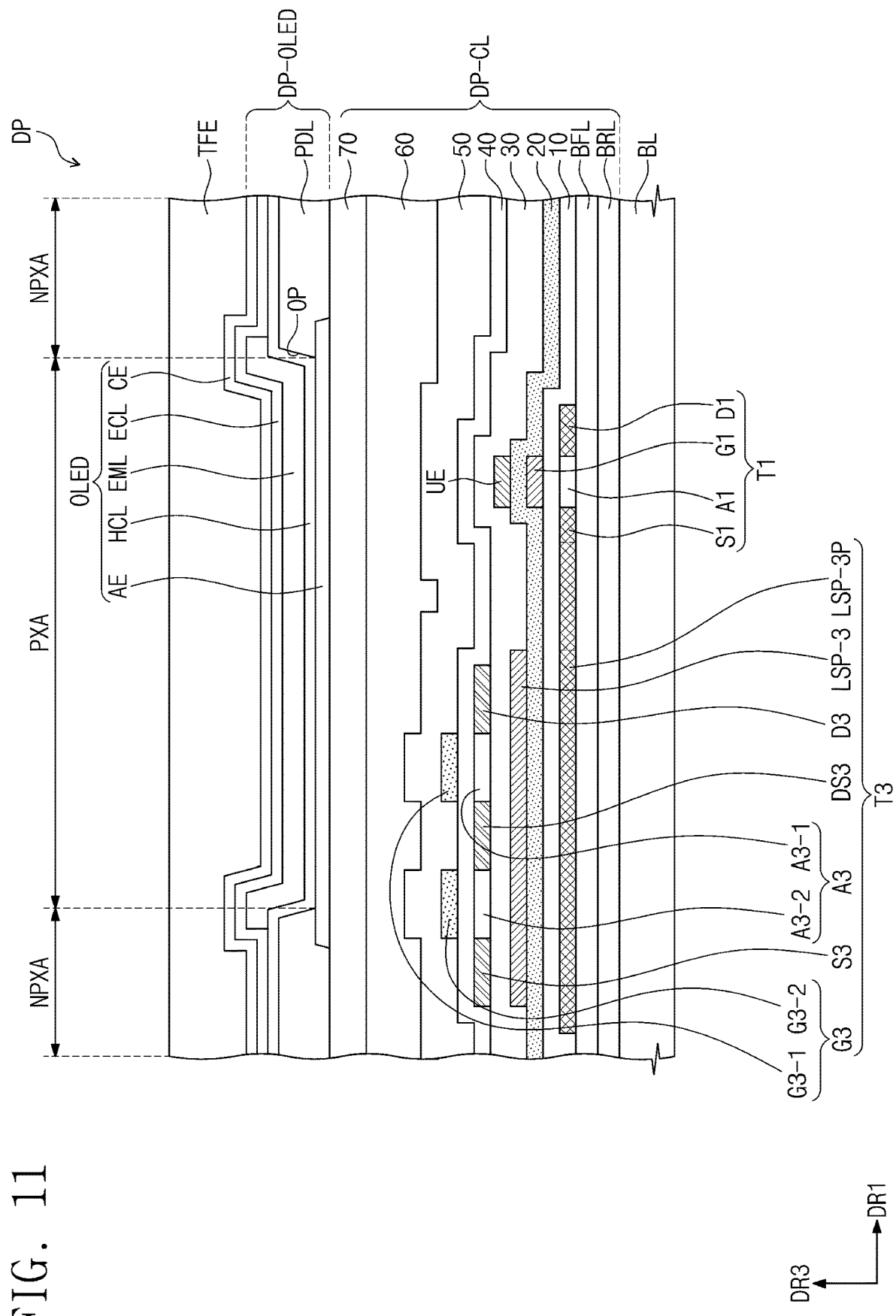
FIG. 11 is a cross-sectional view showing a display panel corresponding to first and third transistors according to an exemplary embodiment of the present inventive concept.

FIG. 11 is a cross-sectional view showing a display panel corresponding to the first and third transistors T1 and T3 according to an exemplary embodiment of the present inventive concept. Hereinafter, detailed descriptions of the same elements as those described with reference to FIGS. 1 to 10K may be omitted.

FIG. 11 shows the third transistor T3 having two gates G3-1 and G3-2. In addition, the third transistor T3 has a double-pattern structure. The first pattern LSP-3P extends from the active area A1 of the first transistor T1. The second pattern LSP-3 is disposed on the same layer as the upper electrode UE.

Referring to FIG. 10D, an area on the plane of the first pattern LSP-3P and an area on the plane of the second pattern LSP-3 may be compared with each other. The second pattern LSP-3 has a smaller area than that of the first pattern LSP-3P and is disposed inside the first pattern LSP-3P. The second pattern LSP-3 at least overlaps the first pattern LSP-3P.

According to the above described embodiments of the inventive concept, the display device includes two types of transistors, and thus, a leakage current of the pixel may be reduced, and a response speed of the light emitting diode may be improved. The leakage current of the pixel may be reduced by the transistor that includes the metal oxide semiconductor, and the response speed of the light emitting diode may be improved by the transistor that includes the polysilicon semiconductor. The leakage current of the pixel may be reduced using the transistor that includes plural gates.

The pattern formed under the metal oxide semiconductor blocks external light traveling to the metal oxide semiconductor. Therefore, a current-voltage characteristic of the metal oxide semiconductor may be prevented from being shifted due to the external light. The pattern may be used as another gate. Characteristics of the transistor that includes the metal oxide semiconductor may be controlled depending on the voltage applied to the pattern.

While the inventive concept has been described with reference to exemplary embodiments thereof, it is understood that various changes and modifications can be made thereto by one of ordinary skill in the art without departing from the spirit and scope of the present inventive concept as set forth in the attached claims.

What is claimed is:

1. A display device, comprising:
a display panel comprising a plurality of pixels, a first pixel of the pixels comprising:
a light emitting diode;
a capacitor connected between a first voltage line and a reference node;
a first transistor connected between the first voltage line and a first, electrode of the light emitting diode;
a second transistor connected between a data line and a source of the first transistor;
a third transistor connected between the reference node and a drain of the first transistor;
a fourth transistor connected between the reference node and a second voltage line;
a fifth transistor connected between the first voltage line and the source of the first transistor;
a sixth transistor connected between the first electrode of the light emitting diode and the drain of the first transistor; and
a seventh transistor connected between the second voltage line and the first electrode of the light emitting diode, each of the third transistor and the fourth transistor comprising:
an active area comprising a metal oxide;
first and second gates disposed on a first side of the active area; and
a pattern disposed on a second side of the active area and overlapping the active area,
wherein an active area of each of the first transistor, the second transistor, the fifth transistor, and the sixth transistor comprises polysilicon, and
wherein the source of the first transistor extends from the active area of the first transistor.

2. The display device of claim 1, wherein each of the first transistor, the second transistor, the fifth transistor, and the sixth transistor is a P-type transistor, and each of the third transistor and the fourth transistor is an N-type transistor.

3. The display device of claim 1, wherein the pattern of each of the third and fourth transistors comprises a metal.

4. The display device of claim 1, wherein the pattern of each of the third and fourth transistors comprises polysilicon.

5. The display device of claim 1, further comprising a semiconductor pattern disposed under the pattern of each of the third and fourth transistors and overlapping the active area of the third transistor.

6. The display device of claim 5, wherein the semiconductor pattern extends from the active area of the first transistor.

7. The display device of claim 1, wherein the seventh transistor comprises:
an active area comprising a metal oxide;
a gate disposed on a first side of the active area; and
a pattern disposed on a second side of the active area.

8. The display device of claim 7, wherein each of the first transistor, the second transistor, the fifth transistor, and the sixth transistor is a P-type transistor, and each of the third transistor, the fourth transistor, and the seventh transistor is an N-type transistor.

9. The display device of claim 1, wherein the second voltage line and the pattern of each of the third and fourth transistors are disposed on a same layer and comprise a same material.

10. A display device, comprising:
a display panel comprising a plurality of pixels, a first pixel of the pixels comprising:
a light emitting diode;
a capacitor connected between a first voltage line and a reference node;
a first transistor connected between the first voltage line and a first electrode of the light emitting diode;
a second transistor connected between a data line and a source of the first transistor;
a third transistor connected between the reference node and a drain of the first transistor;
a fourth transistor connected between the reference node and a second voltage line;
a fifth transistor connected between the first voltage line and the source of the first transistor;
a sixth transistor connected between the first electrode of the light emitting diode and the drain of the first transistor; and
a seventh transistor connected between the second voltage line and the first electrode of the light emitting diode, each of the third transistor and the fourth transistor comprising:
an active area comprising a metal oxide;
first and second gates disposed on a first side of the active area; and
a pattern disposed on a second side of the active area and overlapping the active area,
wherein the pattern of each of the third and fourth transistors comprises a conductive material, and a source of the third transistor is electrically connected to the pattern of the third transistor or source of the fourth transistor is electrically connected to the pattern of the fourth transistor.

11. A display device, comprising:
a display panel comprising a plurality of pixels, a first pixel of the pixels comprising:
a light emitting diode;
a capacitor connected between a first voltage line and a reference node;
a first transistor connected between the first voltage line and a first electrode of the light emitting diode;
a second transistor connected between a data line and a source of the first transistor;
a third transistor connected between the reference node and a drain of the first transistor;
a fourth transistor connected between the reference node and a second voltage line;
a fifth transistor connected between the first voltage line and the source of the first transistor;
a sixth transistor connected between the first electrode of the light emitting diode and the drain of the first transistor; and
a seventh transistor connected between the second voltage line and the first electrode of the light emitting diode, each of the third transistor and the fourth transistor comprising:
an active area comprising a metal oxide;
first and second gates disposed on a first side of the active area; and
a pattern disposed on a second side of the active area and overlapping the active area,
wherein the pattern of each of the third and fourth transistors comprises a conductive material, and the first and second gates of the third transistor are electrically connected to the pattern of the third transistor or the first and second gates of the fourth transistor are electrically connected to the pattern of the fourth transistor.

\* \* \* \* \*